(12) United States Patent
Lux

(10) Patent No.: US 12,140,652 B2
(45) Date of Patent: Nov. 12, 2024

(54) SYSTEMS AND METHODS FOR PROVISIONING TRAINING DATA TO ENABLE NEURAL NETWORKS TO ANALYZE SIGNALS IN NMR MEASUREMENTS

(71) Applicant: Bruker BioSpin GmbH Co. KG, Ettlingen (DE)

(72) Inventor: Silvère Lux, Schirrhein (FR)

(73) Assignee: Bruker BioSpin GmbH & Co. KG, Ettlingen (DE)

( * ) Notice: Subject to any disclaimer, the term of this patent is extended or adjusted under 35 U.S.C. 154(b) by 0 days.

(21) Appl. No.: 18/542,259

(22) Filed: Dec. 15, 2023

(65) Prior Publication Data

US 2024/0151793 A1    May 9, 2024

Related U.S. Application Data

(63) Continuation of application No. PCT/EP2022/056581, filed on Mar. 14, 2022.

(30) Foreign Application Priority Data

Jun. 17, 2021    (EP) .................................... 21179968

(51) Int. Cl.
*G01R 33/46* (2006.01)
*G01N 24/08* (2006.01)
(Continued)

(52) U.S. Cl.
CPC ....... *G01R 33/4625* (2013.01); *G01N 24/087* (2013.01); *G01N 35/00693* (2013.01);
(Continued)

(58) Field of Classification Search
CPC ............ G01R 33/4625; G01R 33/5608; G01R 33/4828; G01N 24/087; G01N 24/08;
(Continued)

(56) References Cited

U.S. PATENT DOCUMENTS

2021/0192350 A1*    6/2021    Bolliger ............. G01R 33/4625

OTHER PUBLICATIONS

International Search Report and Written Opinion for PCT Application No. PCT/EP2022/056581, mailed on Jul. 1, 2022, 14 pages.
Hatami, Nima, et al., "Magnetic Resonance Spectroscopy Quantification Using Deep Learning", Springer Nature Switzerland AG 2018; MICCAI 2018, LNCS 11070; https://doi.org/10.1007/978-3-030-00928-1_53; 2018, pp. 467-475.
Kern, Simon, et al., "Artificial Neural Networks for Quantitative Online NMR Spectroscopy", Analytical and Bioanalytical Chemistry (2020) 412; https://doi.org/10/1007/s00216/020-02687-5, 2020, pp. 4447-4459.
(Continued)

*Primary Examiner* — Rishi R Patel
(74) *Attorney, Agent, or Firm* — Brake Hughes Bellermann LLP

(57) ABSTRACT

A system, method and computer program product for generating a data record of a training dataset set configured to train a neural network for determination of the concentration of a particular target molecule in an NMR sample. An NMR spectrum associated with a known concentration of the target molecule is obtained. The obtained NMR spectrum is adjusted by applying a random shift to generate an adjusted NMR spectrum. A background generator adds a background spectrum which reflects contributions of impurities in the NMR sample. The resulting NMR spectrum together with the information about the concentration of the target molecule is then stored as a new data record of the training dataset.

16 Claims, 15 Drawing Sheets

(51) Int. Cl.
*G01N 35/00* (2006.01)
*G06N 3/0455* (2023.01)
*G06N 3/0464* (2023.01)
*G06N 3/09* (2023.01)

(52) U.S. Cl.
CPC ......... *G06N 3/0455* (2023.01); *G06N 3/0464* (2023.01); *G06N 3/09* (2023.01); *G01N 2035/00702* (2013.01)

(58) Field of Classification Search
CPC .... G01N 35/00693; G01N 2035/00702; G06T 2207/20084; G06T 2207/10088; G06N 3/08; G06N 20/00; G06N 3/02; A61B 5/055
See application file for complete search history.

(56) References Cited

OTHER PUBLICATIONS

Lee, Hyeong Hun, et al., "Deep Learning-Based Target Metabolite Isolation and Big Data-Driven Measurement Uncertainty Estimation in Proton Magnetic Resonance Spectroscopy of the Brain", Magnetic Resonance in Medicine 2020; vol. 84, No. 4, wileyonlinelibrary.com/journal/mrm; 2020, pp. 1689-1706.

Simon, Kern, et al., "Electronic Supplementary Material—Artificial Neural Networks for Quantitative Online NMR Spectroscopy", https://static-content.springer.com/esm/art:10.1007/s00216-020-02687-5/MediaObjects/216_2020_2687_moesm1_esm.pdf; May 9, 2020, 2 pages.

* cited by examiner 90-1

| Target Molecule | Alpha | Target | Score |
|---|---|---|---|
| 1,3-DMAA HCl | *0.698* | *1* | *1.00* |
| 2,5-Dimethoxy-P2NP | 0.000 | 0 | 0.00 |
| 3-Hydroxyphenazepam | 0.000 | 0 | 0.00 |
| 4F-MDMB-BINACA | 0.000 | 0 | 0.01 |
| 4F-P2NP | 0.000 | 0 | 0.00 |
| 5F-Cumyl-P7AICA | 0.000 | 0 | 0.00 |
| 5F-MDMB-P7AICA | 0.000 | 0 | 0.00 |
| 5F-MDMB-PICA | 0.000 | 0 | 0.00 |
| Aildenafil | 0.000 | 0 | 0.00 |
| Bromantan | 0.000 | 0 | 0.01 |
| Bromazolam | 0.000 | 0 | 0.00 |
| ButenafinHCl | 0.000 | 0 | 0.00 |
| Clopidogrel | 0.000 | 0 | 0.00 |
| Fenpiveriniumbromid | 0.000 | 0 | 0.02 |
| Flualprazolam | 0.000 | 0 | 0.03 |
| Flumetsulam | *0.285* | *1* | *1.00* |
| Flunitrazolam | 0.000 | 0 | 0.00 |
| Idra-21 | 0.000 | 0 | 0.00 |
| MDMB-4en-PINACA | 0.000 | 0 | 0.00 |
| MDMB-FUBICA | 0.000 | 0 | 0.00 |
| MDPHP HCl | 0.000 | 0 | 0.00 |
| Mapa | 0.000 | 0 | 0.00 |
| Meclonazepam | 0.000 | 0 | 0.00 |
| Modafinil | 0.000 | 0 | 0.00 |
| Nitrazolam | 0.000 | 0 | 0.00 |
| Nitromethaqualon | 0.000 | 0 | 0.00 |
| P2NP | 0.000 | 0 | 0.00 |
| PV-10 HCl | *0.989* | *1* | *1.00* |
| Sildenafil citrat | 0.000 | 0 | 0.00 |
| Terbinafin HCl | 0.000 | 0 | 0.00 |
| alpha-PhP | 0.000 | 0 | 0.00 |

FIG. 11B

SYSTEMS AND METHODS FOR PROVISIONING TRAINING DATA TO ENABLE NEURAL NETWORKS TO ANALYZE SIGNALS IN NMR MEASUREMENTS

CROSS REFERENCE TO RELATED APPLICATION

This application claims priority to, and is a continuation of, PCT/EP2022/056581, filed on Mar. 14, 2022 and titled "SYSTEMS AND METHODS FOR PROVISIONING TRAINING DATA TO ENABLE NEURAL NETWORKS TO ANALYZE SIGNALS IN NMR MEASUREMENTS," which in turn claims priority to EP Application No. 21179968.9 filed on Jun. 17, 2021, both of which are hereby incorporated by reference in their entireties.

TECHNICAL FIELD

The present description generally relates to signal detection in NMR spectroscopy and more particularly to the generation of training data for a neural network to enable the neural network to determine the concentration of a particular target molecule in an NMR sample, or to identify the presence of a plurality of different molecules in the sample.

BACKGROUND

Nuclear magnetic resonance (NMR) spectroscopy is a spectroscopic technique to observe molecular properties at atomic level. When a sample is placed in a magnetic field, local magnetic fields are induced around the atomic nuclei. These induced fields can be observed by applying radio frequency (RF) pulses to the sample and monitoring the response which is the NMR signal. This NMR signal in the time domain is picked up by sensitive RF receivers. The locally induced fields are specific to the molecular environment of the atomic nuclei, thus giving access to details of the electronic structure of a molecule and its individual functional groups. For example, NMR spectroscopy is used to identify organic compounds, proteins and other complex molecules. Besides identification, NMR spectroscopy provides detailed information about the structure, dynamics, reaction state, and chemical environment of molecules. Common types of NMR are proton and carbon-13 NMR spectroscopy, but it is applicable to any kind of sample that contains nuclear spins with a nuclear magnetic moment larger than zero. In this document, molecules which give rise to an NMR signal are referred to as NMR active molecules or NMR active substances.

Upon excitation of the sample with a radio frequency (typically 60-1200 MHz) pulse, a nuclear magnetic resonance response is obtained which is referred to as free induction decay (FID). The FID is a very weak signal and requires sensitive RF receivers to pick up. A Fourier transform can be applied to extract the frequency-domain spectrum from the raw time-domain FID. A spectrum from a single FID typically has a low signal-to-noise ratio, therefore usually multiple FIDS are acquired and averaged in order to obtain a spectrum with a better signal-to-noise ratio. Decay times of the response to the excitation, typically measured in seconds, depend on the effectiveness of relaxation, which is faster for lighter nuclei and in solids, and slower for heavier nuclei and in solutions whereas they can be very long in gases.

The evaluation of NMR spectra is typically supported by human NMR experts based on their experience with regards to how to interpret certain peaks in an NMR spectrum measured in a real-world NMR experiment. A major task is thereby to identify which signal portions in the measured spectra are associated with peaks that are characteristic of the molecules in the NMR sample which is subject to analysis. Thereby, the position of signal peaks allows to identify which molecules are present in the NMR sample, and the integral of such signal peaks is a measure for the concentration of the respective molecule in said sample.

Typically, it is difficult to identify such characteristic signal peaks because the signal of a typical NMR experiment includes signal contributions caused by sources different from the active molecule itself, such as for example, impurities, phase shifts, baseline effects, noise etc. The determination of molecule concentration and/or the identification molecules in an NMR sample is therefore an error prone procedure which depends a lot on the subjective individual experience of the supporting expert. An existing method for determining the concentration uses a simple numerical integration of the peak of interest. However, this can only work if there is no overlap with any other signal (e.g., background signals). Another known method is fitting with parameter optimization of a spectral model. This requires a prior knowledge of the spectra and shows limitations when the signal of interest is complex and/or is overlapping with signals of other compounds (molecules). For mixture identification, typically peaks are identified in the region of interest using state of the art peak picking procedures and are then compared to a database. Such methods heavily depend on the expertise of the human analyst and are always subjective in this regard.

SUMMARY

There is therefore a need for systems and methods that allow for robust and objective identification of a molecule mix and/or determination of the concentration of a molecule in an NMR sample based on NMR spectra obtained from real-world NMR experiments.

Embodiments of the description as claimed in the independent claims include a computer-implemented method, computer system and computer program product which enable determining the concentration of a single molecule in an NMR sample (quantification embodiment), and further enable identifying a mixture of molecules in such a sample (identification embodiment), by generating synthetic NMR spectra provided as a realistic training dataset to neural networks in accordance with the independent claims. The respective neural networks, when being trained with the generated data records of the training dataset, are then able to autonomously perform said identification or determination tasks. The accuracy of predictions made by neural networks typically improve with the size of the training dataset. Of course, real-world measured NMR spectra with appropriate annotations could be used for training such networks to make respective predictions. However, it is a problem to obtain a sufficiently high number of real-world NMR measurements for building a training dataset large enough for reliable accurate predictions.

It is to be noted that the training dataset for the determination task is different from the training dataset for the identification task. Further, different neural network topologies are used for the two tasks. However, the architectures of the computer systems for generating the data records of the two training datasets are quite similar. In fact, the system for generating the identification training dataset only includes one additional module compared to the system for generating the determination training dataset.

It is to be noted that NMR responses are typically analyzed in the frequency domain. A region of interest, as used herein, refers to a frequency interval which is centered around the peak frequency of a respective signal peak in the NMR spectrum. The region of interest characterizes a part of the spectrum which is associated with a nuclear magnetic resonance response of the NMR active molecules in response to a radio frequency pulse. It is to be noted that in NMR spectroscopy the relative distance of the center frequency of a resonance peak from an arbitrarily chosen reference frequency (standard frequency) is called the chemical shift. A typical reference frequency which is often used is the frequency of the resonance peak of Tetramethylsilane (TMS). The reference frequency is thereby assigned to the chemical shift value "zero". The chemical shift is independent of the base frequency of the spectrometer and is measured in units of "ppm". In the following description and figures, the frequency values in NMR spectra are also referred to as ppm-values on a corresponding ppm scale.

In one embodiment, a computer-implemented method is provided for generating a data record of a training dataset configured to train a neural network (NN) for determination of the concentration of a particular target molecule in an NMR sample. The target molecule (or molecule of interest) is the molecule in the NMR sample whose contributions to the measured NMR spectrum are to be analyzed.

In a first step for generating the data record of the NN training dataset, a computer system executing the computer-implemented method obtains an NMR spectrum being associated with a known concentration of the target molecule in a respective NMR sample. The obtained NMR spectrum has a region of interest, i.e., a region where the NMR spectrum exceeds a predefined noise threshold value. Different implementations may be used to obtain said NMR spectrum.

In a first implementation, the NMR spectrum may be obtained by generating, based on a peak list for the target molecule, a mathematical model of the target molecule using, for example, a pseudo-Voigt function, a Gaussian function, a Lorentzian function, or a Voigt function.

In a second implementation, the NMR spectrum may be obtained by selecting, from a plurality of measured NMR spectra obtained from NMR samples including the target molecule, a measured NMR spectrum with an amplitude at least an order of magnitude higher than any other signal or noise overlapping with the spectrum of the target molecule.

In the following, the obtained NMR spectrum is processed in such a way that finally a resulting NMR spectrum is generated with the resulting NMR spectrum being sufficiently similar to measured NMR spectra so that they can serve as realistic training data for the neural network. Realistic training data, as used herein, relates to a training dataset where the generated synthetic NMR spectra of the training data set show characteristics which make them undistinguishable from real-world measured NMR spectra by the neural network. For this purpose, random perturbations are added to the obtained spectrum such that the obtained spectrum is adjusted to reflect certain characteristics of real-world measured NMR spectra.

In a first adjustment, a random shift in the range [−0.2 ppm, +0.2 ppm] is applied to the obtained spectrum to generate an adjusted NMR spectrum. In other words, the obtained NMR spectrum is shifted along the ppm axis. It can be applied on the whole spectrum or locally on sub-regions. The adjusted NMR spectrum can be described by the equation E1:

$$g(x)=f(x+\Delta x) \tag{E1}$$

with $\Delta x$ being picked randomly in the range of [−0.2, +0.2] ppm.

In the following, when further adjustments are applied to the adjusted NMR spectrum the result is still referred to as "the adjusted NMR spectrum". Once all relevant adjustments have been applied, the final result is referred to as "the resulting spectrum".

Real-world NMR spectra include many background signals which typically reflect the response of impurities in the measured NMR sample. In general, background signals are produced by other molecules present in the sample which are different form the target molecule. The background signals may overlap with the signal(s) of interest. For a realistic training spectrum, it is therefore advantageous to include such background signals. Typically, background signals in a real-world (measured) NMR spectrum appear as so-called multiplets. Such multiplets can be singlets, doublets, triplets or even higher order multiplets, such as quintets, sextets, septets, etc., or any combination thereof (e.g., a triplet of doublets, a doublet of quartets, etc.). With regard to training data records, it is sufficient to add such background signals only in the region(s) of interest to reduce computational overhead.

Therefore, in the following adjustment such multiplets are generated and then added to the region(s) of interest of the adjusted NMR spectrum. To generate a large number of realistic data records for the training dataset, the system generates different background signals for each data record. This is achieved by adding a different number of multiplets to each new training data record by randomly determining the number of multiplets for the new data record. The number of multiplets N is randomly determined in the range from 1 multiplet/ppm times (multiplied with) the width of the region of interest to 100 multiplets/ppm times the width of the region of interest. In other words, N reflects the number of multiplets in the background of a resulting NMR spectrum. N is determined based on a multiplet density which is multiplied with the width of the region of interest. The multiplet density is randomly chosen from a predefined density range, e.g., in the density range [1/ppm, 100/ppm]. Advantageously, density sub-ranges, such as [2/ppm, 20/ppm] may be used. N reflects the number of multiplets for the background spectrum in the region of interest of the resulting NMR spectrum. In a scenario where singlets are generated, the multiplet density corresponds to the peak density in the region of interest. The randomly determined number N serves as the maximum value of a loop counter where in each loop iteration the system adds a new multiplet to the adjusted NMR spectrum as part of the background spectrum in the region of interest. With each loop iteration, the system generates a mathematical model for a multiplet. The mathematical model for the multiplet may include a description of peak parameters such as the peak position (in the frequency area), amplitude, shape etc. by mathematical expressions.

The generation of the multiplet models can be based on two alternative implementations. In a first implementation, a mathematical model of a singlet or a doublet or a triplet is generated based on a random peak list using one of the following mathematical functions: a pseudo-Voigt function, a Gaussian function, a Lorentzian function, or a Voigt function. The peak list provides random peak positions and random peak amplitudes of a corresponding singlet, doublet or triplet. By applying any of the above mathematical functions, realistic multiplet peak shapes are generated from the peak position and amplitude data. Thereby, the peak list includes random peak positions covering at least the region(s) of interest. Advantageously, the multiplicity of the multiplet to be added in a particular loop iteration is randomly determined. That is, in each iteration one of a singlet, doublet or triplet or a multiplet with higher multiplicity is generated. For generating realistic background spectra, it has turned out that it is sufficient to use singlets, doublets and triplets. Higher order multiplets can be used but do not significantly improve the generated training data set. In case of a singlet, a peak position describes the position of the maximum amplitude of the singlet. For doublets, triplets or multiplets of higher order (multiplicity), random peak positions may specify the positions of each peak of the respective multiplet, or a single peak position for the multiplet may specify the center of the multiplet and the peaks of the multiplet are generated symmetrically around the single peak position by using characteristic distances between the respective multiplet peaks. For example, the characteristic distance between the peaks of a particular multiplet may be randomly determined within a predefined interval of realistic peak distances within multiplets.

In a second implementation, real-world measured spectra are used to obtain the information about multiplet peak positions in measured spectra. For example, the system can extract peak positions and intensities of multiplet-related peaks in the region of interest from a database of two-dimensional measured NMR spectra by using of a peak picking algorithm. Peak picking algorithms are well known in the art. The extracted peak positions and intensities are then used to generate the mathematical model of corresponding multiplets using one of the following functions: a pseudo-Voigt function, a Gaussian function, a Lorentzian function, or a Voigt function. This can be advantageous over the first implementation in that the peak positions are correlated with impurities in real-world NMR samples whereas in the first implementation peak positions are generated randomly. Therefore, the background spectra generated by the second implementation may be even more realistic. In this implementation, although a plurality of peaks belongs to real-world multiplets (multiplets present in a measured spectrum) with a multiplicity greater than one, each extracted peak is treated like a singlet by the multiplet generator. That is, in this implementation, only singlets are generated by the multiplet generator. The multiplet density in this implementation corresponds to the peak density of the real spectrum. That is, the multiplet density for the generation of the multiplet peaks as part of the background spectrum in the region of interest can be considered as a peak density corresponding to an "artificial multiplet density" which is different from the real-world multiplet density. However, the final result with regard to peaks in the background spectrum is the same for the generated and real-world background spectra.

The generated multiplet model is then adjusted by applying a random shift in the range of the region of interest to obtain an adjusted mathematical model of the multiplet. As for the random shift applied to the originally obtained NMR spectrum, the effect of the random shift is that each generated spectrum (data record of the training dataset) shows a slight shift variation over other generated spectra which makes the entire training dataset more realistic (more similar to real-world measured NMR spectra of multiple measurements and multiple samples).

In each iteration of the background generation loop, the adjusted mathematical model is added to the adjusted NMR spectrum. The adjusted mathematical model of each multiplet is shifted in the region of interest. Therefore, the adjusted mathematical models are all added in the region of interest (ROI). Adding the generated multiplets only within the ROI is advantageous because only the ROI needs to by analyzed. Placing the generated multiplets throughout the entire spectrum would create unnecessary computational overhead. After the final loop iteration, the resulting NMR spectrum is obtained where all generated multiplets have been added. In case an NMR spectrum includes multiple regions of interest, the herein disclosed method can be independently performed for each ROI.

The resulting NMR spectrum is then stored together with information about the concentration of the target molecule as a new data record of the training dataset. Thereby, the resulting NMR spectrum serves as the training input to the neural network and the information about the concentration represents the ground truth when training said neural network. In one implementation, the clean signal of the target molecule is stored as the information about the concentration of the target module. The clean spectrum is the spectrum of the target molecule without any adjustments, such as background or noise signals. In this implementation, the concentration value is implicitly included in the clean spectrum as it can be computed as the integral of the clean spectrum. In another implementation, instead of the clean spectrum, the known concentration value may be stored directly.

To obtain a training dataset for the neural network achieving a sufficient level of prediction accuracy, the system can generate a large number of training data records which advantageously is in the order of 104 to 107. High prediction accuracy has been achieved with training datasets including 1 to 5 million of training data records. For this purpose, the above disclosed method is repeated until the desired number of training data records has been generated and stored in the training dataset. When repeating the steps for generating a new training spectrum, the initially obtained NMR spectrum is typically different from the previous spectrum generation run. For example, when using a mathematical model for generating the spectrum, different concentration values (e.g., randomly determined concentration values) of the target molecule and/or slight variations in the respective peak positions can be used for different spectrum generation runs. When using measured NMR spectra for the obtained spectrum, measurements obtained from different samples can be used to introduce more variation into the generated training data records.

Optional embodiments include further steps for adjusting the NMR spectrum to make it even more realistic. For example, the method may include further steps for line broadening of the signal peaks. The line broadening steps can include one or more of the following steps: applying to the adjusted NMR spectrum a Gaussian convolution with a random width in the range from 0.5 to 2.5 Hz, and applying to the adjusted NMR spectrum a convolution function with a Pseudo-Voigt kernel to obtain a random line shape, wherein the gaussian ratio of the Pseudo-Voigt kernel is in the range from 0 to 1.

In a further embodiment, a scaling adjustment can be further applied to the adjusted NMR spectrum. For scaling a random multiplication factor in the range from 0 to an amplitude threshold is applied to the adjusted NMR spectrum, wherein the amplitude threshold corresponds to an expected maximum concentration of the target molecule in the NMR sample. Typically, the expected maximum concentration is in a range from 1 mg/kg to 1000 mg/kg, depending on the NMR sample.

Similar line broadening steps can be applied to adjust a generated mathematical model of a multiplet with one or more of the following steps: applying to the adjusted mathematical model a Gaussian convolution with a random width in the range from 0.5 to 2.5 Hz, and applying to the adjusted mathematical model a convolution function with a Pseudo-Voigt kernel to obtain a random line shape, with the gaussian ratio of the Pseudo-Voigt kernel in the range from 0 to 1.

Also, scaling can be applied to the adjusted mathematical model by applying to the adjusted mathematical model a random multiplication factor in the range from 0 to an amplitude threshold, wherein the amplitude threshold corresponds to an expected maximum concentration of the target molecule in the NMR sample. The amplitude threshold used for further adjusting the adjusted NMR spectrum can be the same threshold as for adjusting the mathematical model of a multiplet.

A further optional adjustment relates to adding a white Gaussian noise to the adjusted NMR spectrum prior to storing the resulting NMR spectrum to the training dataset. The noise adjustment includes: multiplying the adjusted NMR spectrum by a decaying exponential with a time constant LB in the range of from −0.2 to 3 seconds; applying an inverse Fourier transform; and scaling in order to have a standard deviation that is equal to the standard deviation of the noise measured in a real-world spectrum. Thereby, this standard deviation depends on measurement settings and the type of NMR spectrometer used for the measurement. A person skilled in the art can derive an appropriate standard deviation for a respective measurement setting.

In one embodiment, a computer program product is provided for generating a data record of a training dataset configured to train a neural network for determination of the concentration of a particular target molecule in an NMR sample. The computer program product has computer-readable instructions that, when loaded into the memory of a computing device and processed by one or more processors of the computing device, cause the computing device to execute the method steps according to the herein disclosed method to train a neural network for determination of the concentration of a particular target molecule in an NMR sample.

In one embodiment, a computer system with a memory and one or more processors is provided for generating a data record of a training dataset configured to train a neural network for determination of the concentration of a particular target molecule in an NMR sample. The computer system has functional modules implemented by software. These functional modules implement functions of the computer system to be executed at runtime by the computer system. The implemented functions are configured to execute said computer program product for performing said method. The function modules of the computer system are described in detail in the detailed description.

In one embodiment, the to-be-trained neural network has a topology with a denoising autoencoder configured to remove noise and background signals from training input sample signals. Thereby, a training input sample signal is encoded to a number of components, with the number of components in the range from 1 to 32, to enforce the neural network to learn only relevant features. The training input sample signal is decoded to obtain as output the information about the concentration of the target molecule. Dependent on the implementation, the output may be the clean signal for the NMR spectrum associated with the target molecule, or it may be the plain concentration value.

With some minor modifications, the above disclosed method can be transformed into a computer-implemented method for generating a data record of a training dataset configured to train a neural network for identification of different molecules present in an NMR sample. In this embodiment, the respective computer system obtains an NMR spectrum for each molecule present in a respective NMR sample. The molecules present in such (virtual) NMR sample are randomly selected from a molecule database. Each obtained NMR spectrum has again a region of interest, wherein the region of interest is a region in the obtained NMR spectrum where the respective NMR spectrum exceeds a predefined noise threshold value. In order to allow for the use of the adjustment steps disclosed for the determination method, the system merges the obtained NMR spectra into a consolidated NMR spectrum reflecting a mixture of the selected different molecules in the respective (virtual) NMR sample. Further, a list of the identifiers of the underlying molecules of interest is kept. For example, the list of identifiers can be implemented via a vector having a vector element for each molecule in the molecule database where the vector elements representing the molecules present in the NMR sample are set to '1', and all other vector elements are set to '0'. When comparing this identification embodiment with the quantification embodiment, the consolidated NMR spectrum is now further processed like the single obtained NMR spectrum in the quantification embodiment. For this reason, the following description is kept short as it would be redundant to the previously described embodiment in large parts.

The following steps are thereby executed by the system focused on the identification embodiment:
  adjusting the consolidated NMR spectrum by applying a random shift in the range from −0.2 ppm to +0.2 ppm to obtain an adjusted NMR spectrum;
  randomly determining, in the range from 1 multiplet/ppm multiplied with the width of the region of interest to 100 multiplets/ppm multiplied with the width of the region of interest, a number of multiplets N reflecting the background of a resulting NMR spectrum;
  repeating N times:
    generating a mathematical model of a multiplet;
    adjusting the generated mathematical model of the multiplet by applying a random shift in the range of the region of interest to obtain an adjusted mathematical model of the multiplet;
    adding the adjusted mathematical model to the region of interest of the adjusted NMR spectrum; and
  storing the identifiers of the underlying molecules together with the adjusted NMR spectrum after the last iteration as the resulting NMR spectrum as a new data record of the training dataset.

All the other optional adjustment steps of the quantification embodiment are also applicable for the identification embodiment. Similar as for the quantification embodiment, the generation and storage of training data records is repeated until a desired size of the corresponding training dataset is achieved.

A major difference in the identification embodiment is the ground truth which is a vector indicating the identifiers of the molecules present in the NMR sample. This also implies a different topology for the neural network to be trained for the mixture identification.

In one embodiment, a computer program product is provided for generating a training dataset configured to train a neural network for identification of different molecules of interest present in an NMR sample. The computer program has computer-readable instructions that, when loaded into the memory of a computing device and processed by one or more processors of the computing device, cause the computing device to execute the method steps of the method according to the identification embodiment disclosed herein.

In one embodiment, a computer system is provided with a memory and one or more processors for generating a training data set configured to train a neural network for identification of different molecules of interest present in an NMR sample. The computer system has functional modules implemented by software. The functional modules implement functions of the computer system to be executed at runtime by the computer system, with the implemented functions configured to execute the method steps of the identification embodiment at runtime.

The to-be-trained neural network in the identification embodiment may have a topology comprising a convolutional neural network with convolution blocks implementing a convolution function, a pooling function and an activation function, followed by a fully connected layer with a size equal to the number of molecules in the molecule database. The molecule database may include data for several hundreds of molecules which are potential candidates for NMR analysis. The output of the neural network in the identification embodiment in response to a test input (real-world NMR spectrum) is a score in the range of 0 to 1 for each molecule of the molecule database. If the score for a particular molecule is exceeding 0.5, it can be seen as an indicator that the respective molecule is present in the analyzed NMR sample.

Further aspects of the description will be realized and attained by means of the elements and combinations particularly depicted in the appended claims. It is to be understood that both, the foregoing general description and the following detailed description are exemplary and explanatory only and are not restrictive.

BRIEF DESCRIPTION OF THE DRAWINGS

FIG. 11B shows a scoring output for the measured NMR spectrum with the mixture of the three molecules present in the respective sample.

DETAILED DESCRIPTION

Figure 1:
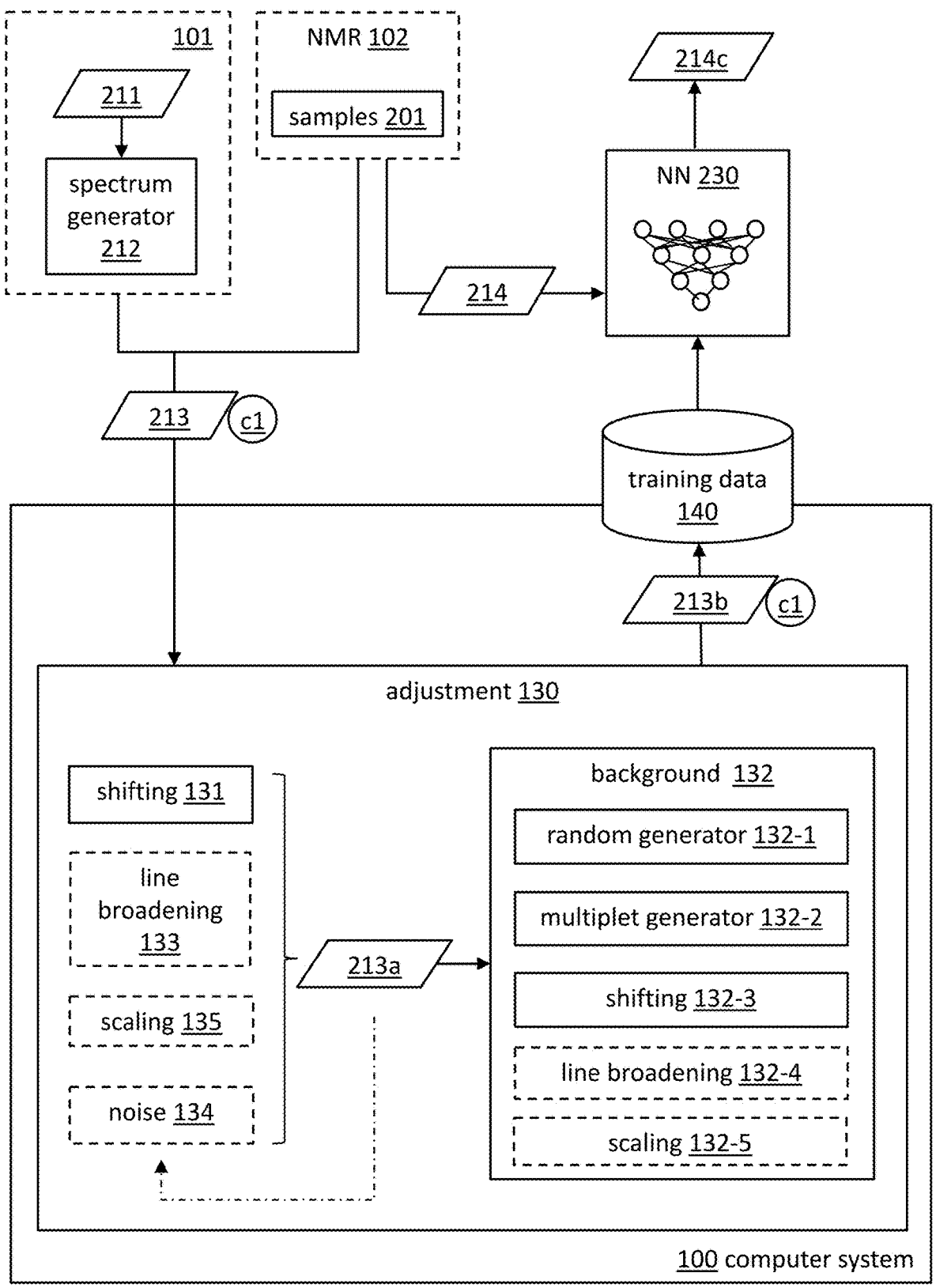
FIG. 1 includes a block diagram of a computer system for generating a training dataset set to train a neural network for determination of the concentration of a particular target molecule in an NMR sample according to a quantification embodiment.
Figure 2:
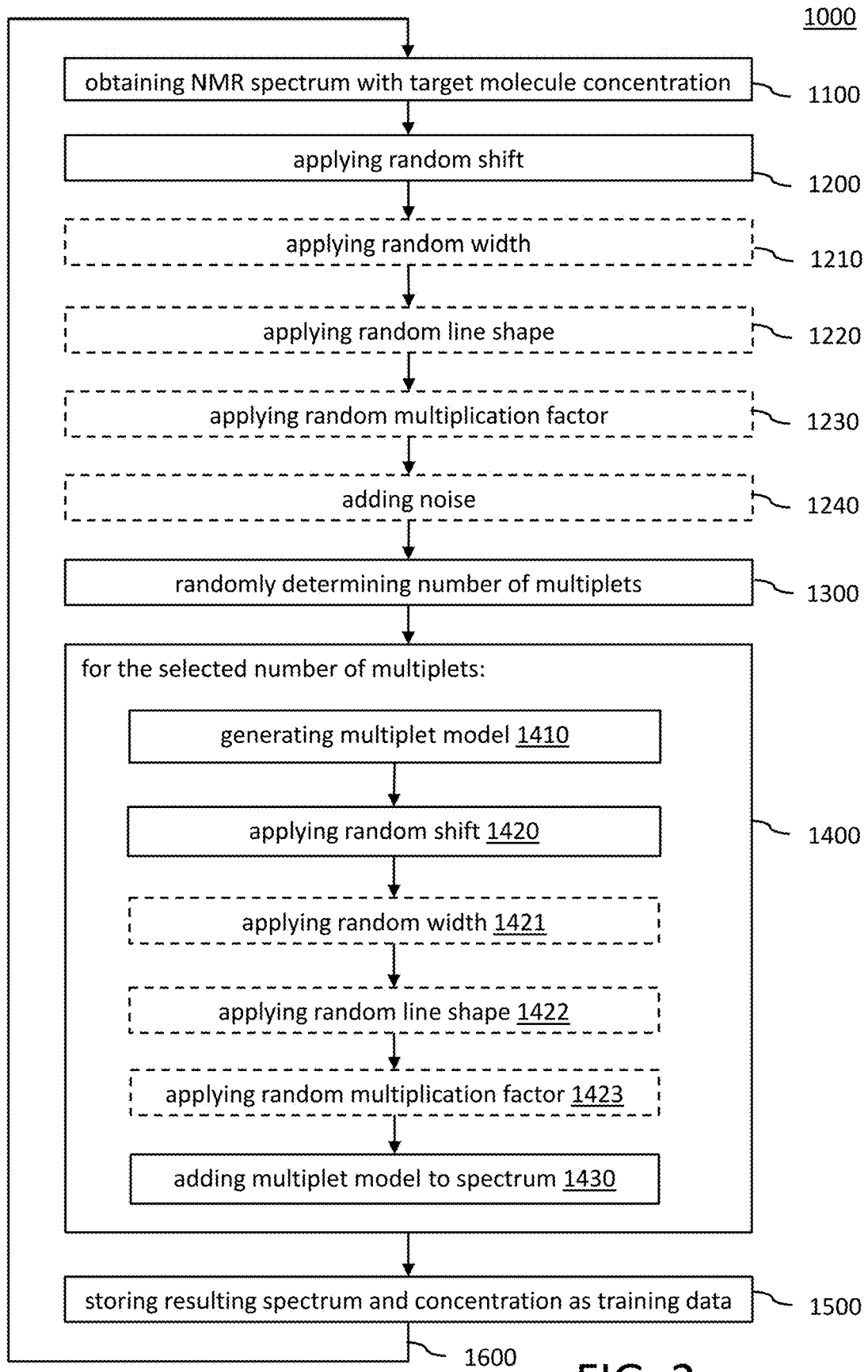
FIG. 2 is a simplified flow chart of a computer-implemented method for generating a data record of a training dataset set configured to train a neural network for determination of the concentration of a particular target molecule in an NMR sample according to the embodiment.

FIG. 1 illustrates a block diagram of a computer system 100 for generating a realistic training dataset 140 for training a neural network 230 (NN) for signal analysis in NMR spectra 214 according to a quantification embodiment. Once NN 230 has been trained accordingly, it can predict the concentration 214c of a particular target molecule in an NMR sample 201 by simply receiving a measured NMR spectrum 214 associated with said NMR sample. The system 100 of FIG. 1 is described in the context of the simplified flow chart of a computer-implemented method 1000 for generating such a realistic training dataset as illustrated in FIG. 2. Therefore, the following description of the quantification embodiment refers to reference numbers used in FIG. 1 and FIG. 2. The system 100 is thereby configured to execute the method 1000 when loading a respective computer program into a memory of the system and executing said program with processing means of the system.

In the example embodiment of FIG. 1, the system 100 obtains 1100 an NMR spectrum 213 associated with a known concentration c1 of the target molecule. The concentration c1 is implicitly included in the NMR spectrum and can be computed as the integral of the signal associated with the target molecule. In an alternative implementation, c1 may be directly provided together with the obtained spectrum 213. The system 100 is communicatively coupled with an NMR spectrum provisioning entity 101, 102 and the spectrum 213 is then received from said entity via an appropriate interface.

In one implementation, the NMR spectrum provisioning entity is a spectrum generator 212 which generates a mathematical model of the target molecule based on a peak list 211 for the target molecule by using an appropriate generation function. The spectrum generator 212 may be implemented as an integral module of the computer system 100 or it may be operated on a remote computing device which is communicatively coupled with the computer system 100.

The spectrum generator may use, for example, a pseudo-Voigt function, a Gaussian function, a Lorentzian function, or a Voigt function.

For example, using a pseudo-Voigt function is advantageous when the to-be-modelled NMR spectrum has a simple pattern (typically with a number of peaks less than 10). The pseudo-Voigt function is defined below in equation E2 and is a mixture of a Gaussian and a Lorentzian function.

TABLE 1 parameters of pseudo-Voigt function $$f(x) = \left[\frac{a}{\sigma\sqrt{2\pi}}\exp\frac{-(x-x_0)^2}{2\sigma^2} + \frac{(1-a)}{\pi}\left(\frac{\sigma}{(x-x_0)^2+\sigma^2}\right)\right] \times amp \quad (E2)$$

with $$\sigma = \frac{width}{field} \quad (E3)$$

and

| | |
|---|---|
| $x_0$ | peak position in ppm |
| width | peak width in Hz |
| field | spectrometer field in MHz |
| α | ratio between Gaussian and Lorentzian functions |
| amp | signal amplitude |

Figure 3A:
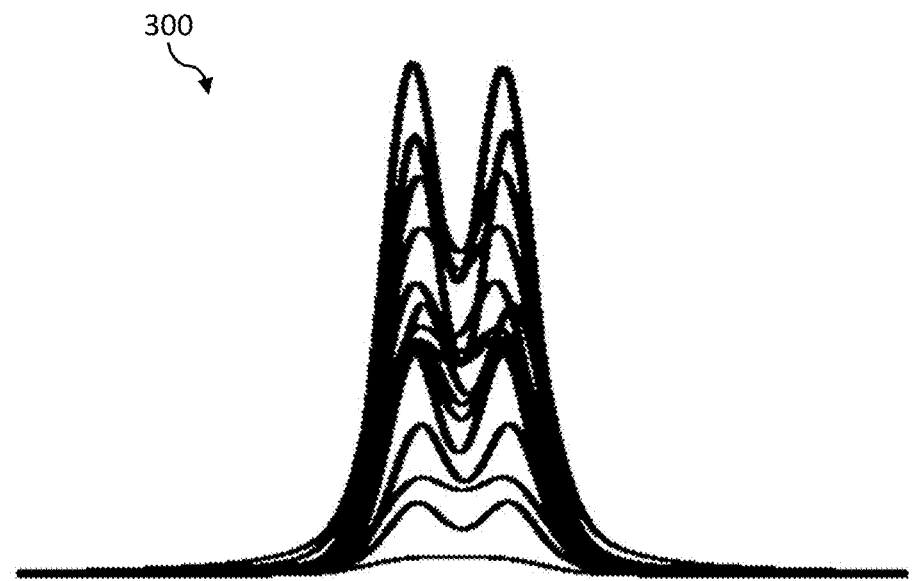
FIG. 3A illustrates an example of Mannose signals which have been generated with different combinations of model parameters.

It requires to know the position $x_0$ of each peak in the signal. Such a peak list of the target molecule can either be obtained by measuring an NMR spectrum of a sample including the target molecule or by using a database providing such peak lists, such as for example, the Human Metabolome Database (HMDB) available at https://hmdb.ca. FIG. 3A illustrates an example 300 of Mannose signals (i.e., signals from the chemical substance Mannose, for example retrievable at https://hmdb.ca/spectra/nmr_one_d/1438) which have been generated with different combinations of model parameters.

In another implementation, the NMR spectrum provisioning entity is an NMR spectrum storage location 102 where NMR spectra are provided which were obtained by a respective NRM spectrometer from samples 201 including the target molecule. Real-world measured NMR spectra show deviations and/or measurement variations leading to a spectral variation in peak position and line shapes. To match this diversity of signals a modification may be applied to such parameters which may be randomly chosen in the ranges as shown in table 2 using, for example, a uniform distribution (it is also possible to normal or gamma distributions):

TABLE 2 parameter ranges of pseudo-Voigt function

| | |
|---|---|
| $x_0$ | $[x_0 - 0.0015, x_0 + 0.0015]$ |
| width | [0.5, 2.5] |
| α | [0, 1] |
| amp | $[0, amp_{max}]$ | with $amp_{max}$ being chosen to match the quantification range of the target molecule.

Using a measured NMR spectrum instead of a mathematical model can be advantageous for more complex patterns because the approach is applicable regardless of the peak pattern complexity. A precondition is that the concentration of the target molecule in the sample from which the spectrum was obtained is known. Furthermore, the concentration must be high enough so that the spectrum associated with the target molecule has an amplitude at least an order of magnitude higher than any other signal or noise overlapping with the spectrum of the target molecule. Advantageously, the signal-to-noise ratio exceeds a value of 100. In this context, the background of the spectrum is to be understood in a general way in that it includes the gaussian noise of the spectrometer itself and any other peak that may overlap with the spectrum of the target molecule.

In the following, several adjustments are applied to the obtained NMR spectrum to match the diversity of signals observed in real-world spectra by an adjustment module 130 of system 100.

A shifting module 131 applies 1200 a random shift in the range from −0.2 ppm to +0.2 ppm to generate an adjusted NMR spectrum 213*a*. Thereby, the obtained NMR spectrum is shifted along the ppm axis. It can be applied on the whole spectrum or just locally on sub-regions of the spectrum. For each new data record that is generated for the training dataset a (different) random shift value is determined so that a huge diversity within said range is introduced into the training dataset by using a respective randomizer of the shifting module 131. Further adjustments are then applied to the adjusted spectrum 213*a*.

A background generator 132 is adding so called multiplets to the adjusted spectrum. Multiplets can be singlets, doublets or triplets and are signals in an NMRS spectrum caused by impurities in the NMR sample. A major problem with multiplets for the later analysis of an NMR spectrum relates to multiplets whose signals overlap with the signal of the target molecule. Therefore, a training dataset for the determination neural network needs to learn to determine the actual concentration of the target molecule even if the respective peak has an overlap with multiplet peak(s) and cannot be separated from such peaks by a human analyzer.

To generate realistic training data records, the background module 132 has a random generator which randomly determines 1300 for each new training data record a number of multiplets N reflecting the background of a resulting NMR spectrum. The number N is generated in the range from 1 multiplet/ppm multiplied with the width of the region of interest to 100 multiplets/ppm multiplied with the width of the region of interest (ROI). In other words, the number of background multiplets to generate is a random number between 1 and N. It is basically defined by a multiplet density. N depends on the width of the region of interest (in ppm). For example, a multiplet density can be defined in the range [2,20] multiplets/ppm. N=(multiplet density)*(ROI width). The range of [2,20] multiplets/ppm has been empirically proven to be sufficient for generating realistic background spectra in the region of interest. It is to be noted that when using the second implementation of the multiplet generator where multiplet peak positions are extracted from measured NMR spectra, the multiplet density corresponds to the peak density of extracted peaks because in this implementation only singlets are generated based on the extracted peak positions.

In the following, a loop with N iterations is processed where, in each iteration, a multiplet is added to the background of the adjusted spectrum 213*a*. That is, the loop repeats (step 1400) N times the following steps:
  generating 1410 a mathematical model of a multiplet;
  adjusting the generated mathematical model of the multiplet by applying 1420 a random shift in the range of the region of interest to obtain an adjusted mathematical model of the multiplet; and
  adding 1430 the adjusted mathematical model to the adjusted NMR spectrum 213*a* in the region of interest.

For generating 1410 the mathematical model of the multiplet of the current loop iteration, different implementations of a multiplet generator module 132-1 can be used.

In a first implementation, the multiplet generator 132-2 generates a mathematical model of a singlet or a doublet or a triplet based on a random peak list using one of the following functions: a pseudo-Voigt function, a Gaussian function, a Lorentzian function, or a Voigt function. This implementation is similar to the previously described implementation of generating a mathematical model of the initially obtained NMR spectrum. The random peak list may include positions and amplitudes of a random singlet peak, two random doublet peaks or three random triplet peaks.

For example, singlets, doublets or triplets randomly generated by, for example, using the pseudo-Voigt function described earlier may follow the rules as defined in the following:

| | |
|---|---|
| singlet | $f(x)$ |
| doublet | $f(x + \Delta x) + f(x - \Delta x)$ |
| triplet | $(f(x + \Delta x) + f(x - \Delta x)) \times 0.5 + f(x)$ |

With $\Delta x$ randomly chosen in the range [2, 6] ppm.

The x0 parameter of the pseudo-Voigt function (i.e., the peak position) may follow a uniform distribution in the region of interest. But it is not restricted to a uniform distribution, it can follow any distribution that would be relevant. Normally the ROI is annotated manually by a user. The peak amplitude is chosen between 0 and Ampmax. Ampmax is chosen to be consistent with real-world spectra, e.g. <=10×Ampmax of the target molecule spectrum.

Figure 3B:
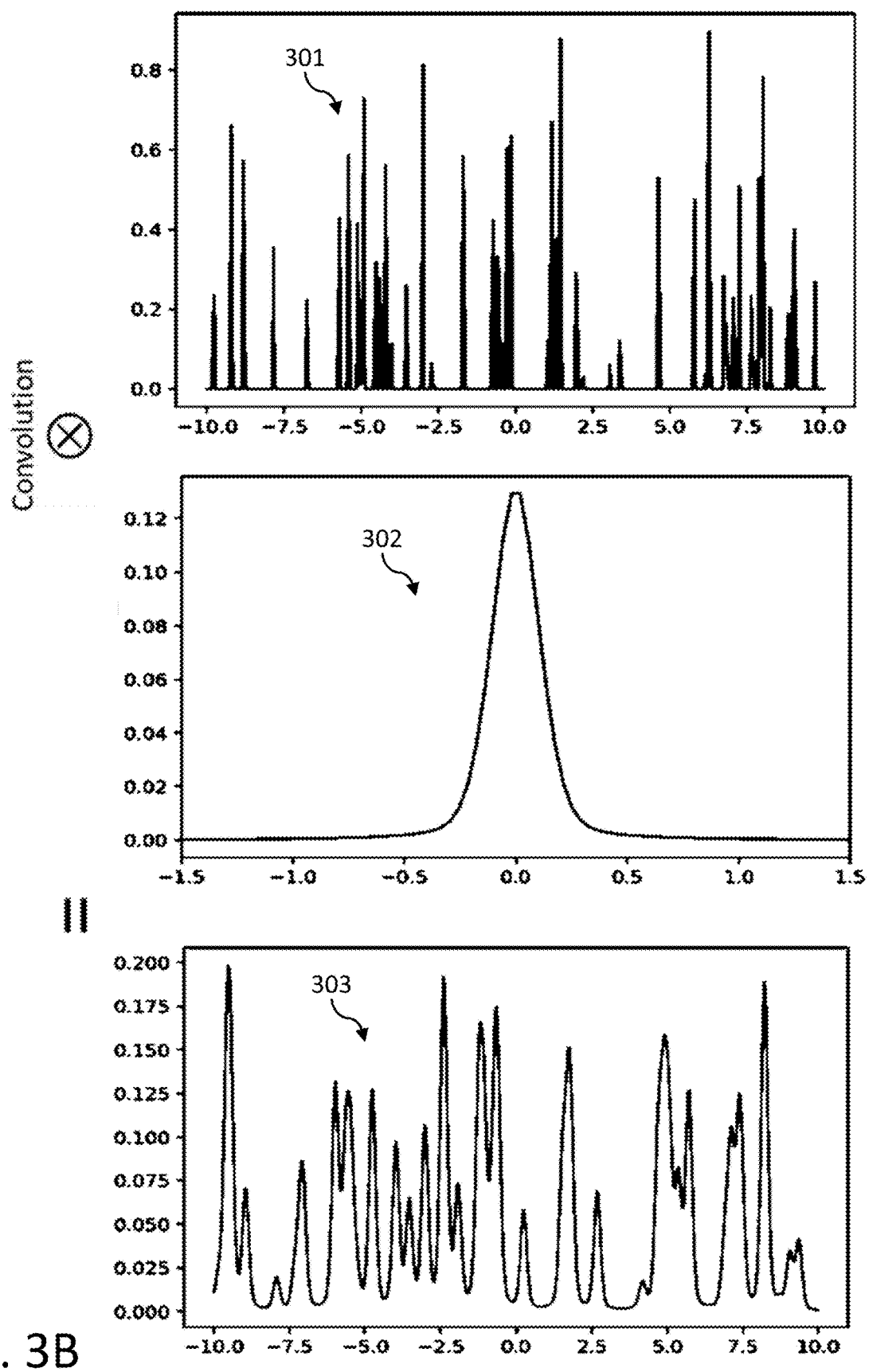
FIG. 3B illustrates generation of a background spectrum based on convolution of Dirac delta functions.

In an alternative implementation for speeding up computation time, a Dirac delta function is computed for each peak of a random peak list. In this implementation only singlets are generated. Therefore, the respective multiplet density is effectively a peak density. The peak density can be defined in the range [2,20] peaks/ppm with the number of peaks M=(peak density)*(ROI width). FIG. 3B illustrates a plurality 301 of Dirac delta functions representing respective peaks. Then a convolution with a pseudo-Voigt kernel 302 is applied. This avoids to directly compute a pseudo-Voigt function for each peak and can significantly speed-up the computation when the number of peaks to generate is large (e.g., >100). However, in the resulting background spectrum 303, all the peaks have the same line shape which leads to a less realistic background of the training spectrum. In one embodiment, this alternative implementation can replace the background generation steps 1300 and 1400 (cf. FIG. 2). It is to be noted that this alternative implementation for generating a background spectrum can also be used for the later described identification embodiment by replacing the steps 2400 and 2500 (cf. FIG. 9).

Figure 3C:
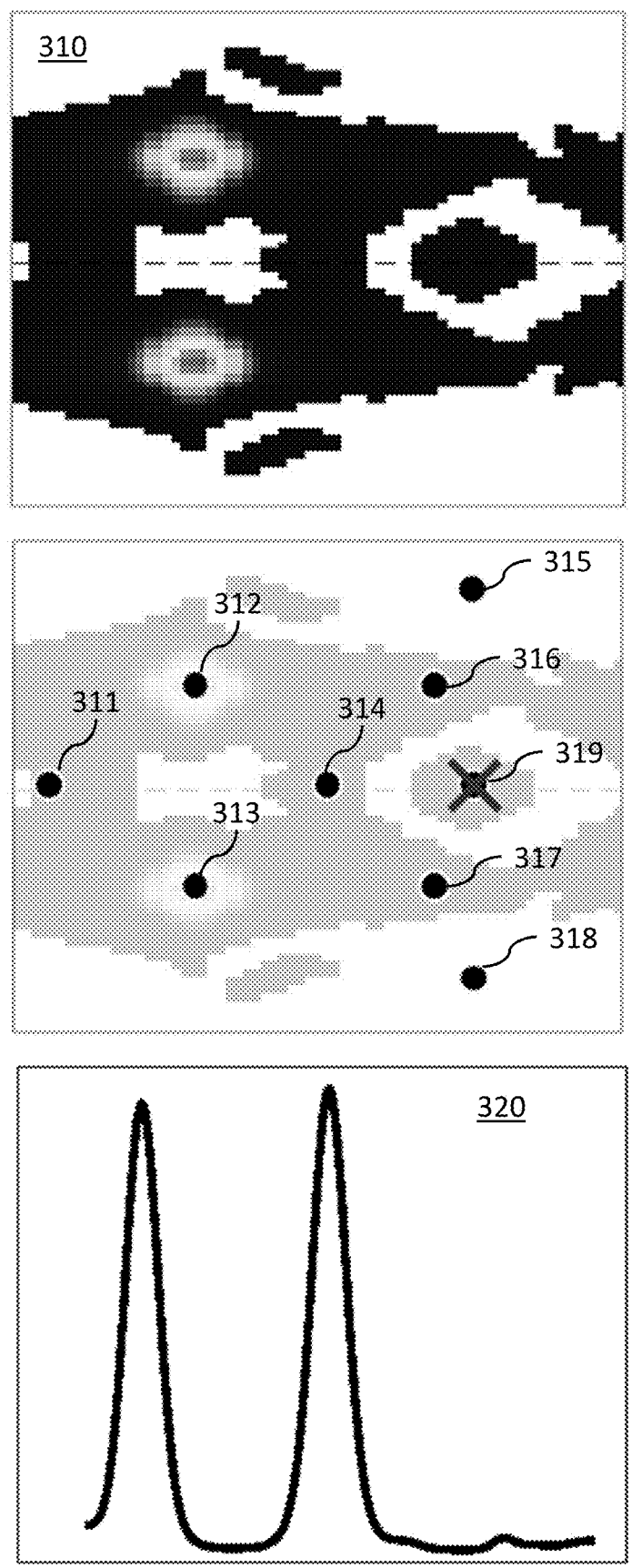
FIG. 3C illustrates an example of multiplet peak extraction from a measured NMR spectrum for generation of a mathematical model of a multiplet.

In another implementation of the multiplet generator 132-2, real NMR spectra from a database of real NMR spectra are used as the basis for generating the mathematical multiplet models. In this implementation (illustrated in FIG. 3C), peak positions and peak intensities are extracted in the region of interest. Advantageously, 2D spectra 310 are used for this purpose. However, the approach can also be applied to 1D spectra with lower accuracy. The peak positions 311 to 319 can be extracted by using, for example, an extrema search algorithm or any other peak picking algorithm. Peaks 319 associated with the target molecule are ignored to keep only the peaks 311 to 318 belonging to the background. This requires prior knowledge of the peak position 319 of the target molecule either from measurement result of a real NMR spectrum or from respective information in an appropriate online database. The extracted peak positions and intensities are then used to generate the mathematical model 320 of the respective multiplets using again one of the following functions: a pseudo-Voigt function, a Gaussian function, a Lorentzian function, or a Voigt function. In other words, when knowing positions and intensities of the background peaks the multiplet generator can generate a 1d signal using, for example, the pseudo-Voigt function (in a similar way as described earlier). Parameters width and a of the pseudo-Voigt function can be randomized using the same range as shown in table 2. As mentioned earlier, in this implementation only singlets are generated and the respective multiplet density corresponds to a peak density.

Thereby, the number of real-world background spectra stored in the database is advantageously at least a tenth of the number of synthetic background spectra to be generated. For instance, to generate 105 synthetic background spectra, the database advantageously contains at least 104 real-world background spectra.

After the processing of all loop iterations 1400 the multiplets defining the entire generated background spectrum for the currently processed training data record have been added to the region of interest of the adjusted spectrum 213*a* and the resulting spectrum 213*b* is now stored 1500 together with the respective information regarding the concentration c1 of the target molecule as a new data record of the training dataset 140. The training dataset 140 may be implemented as an integral component of system 100. Alternatively, the training dataset 140 may be stored on a remote storage device (e.g., a cloud server) which is communicatively coupled with the system 100. The generation and storage of training data records is then repeated 1600 until the training dataset reaches a size which is appropriate for training the respective neural to make concentration predictions with sufficient accuracy and reliability.

Figure 4:
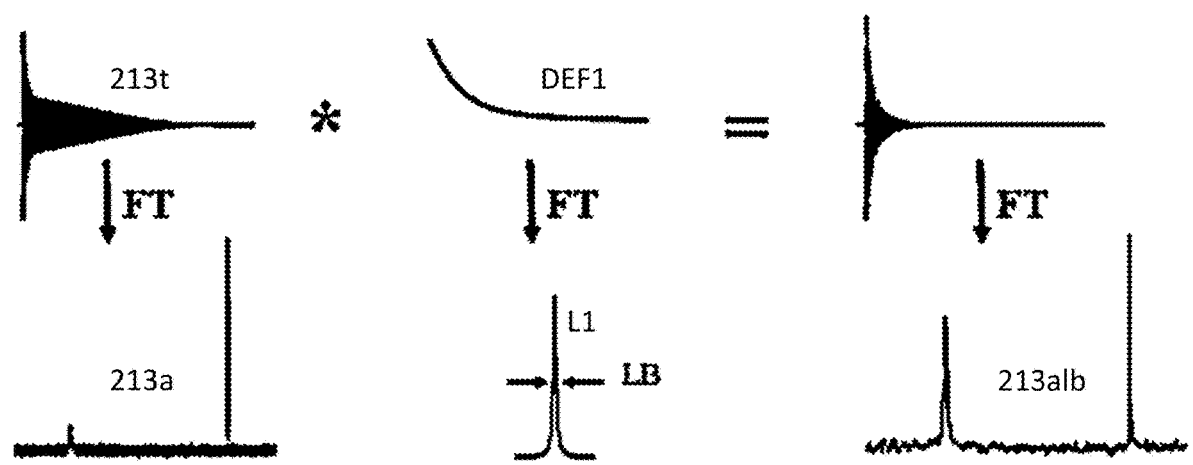
FIG. 4 illustrates an example of an exponential line broadening filter.

In optional embodiments, the adjustment module 130 of system 100 includes further modules for applying further adjustments to the adjusted spectrum 213*a* to make the adjusted spectrum even more realistic. For example, a line broadening module 133 may be used implementing an exponential line broadening filter as illustrated in FIG. 4. The Fourier transform FT of the NMR data 213*t* (time domain) is multiplied by a decaying exponential function DEF1 (the Fourier transform of which is a Lorentzian line L1 with a full width at half height of LB). If LB<0 the signal is sharpened. If LB>0, the signal is broadened. The LB parameter is picked randomly in the range of [−0.2,3]. The adjusted NMR spectrum 213*alb* (frequency domain) after line broadening is illustrated in the lower right of FIG. 4.

The line broadening module 133 may further be configured to adjust the adjusted NMR spectrum by applying 1210 to the adjusted NMR spectrum 213*a* a Gaussian convolution with a random width in the range from 0.5 to 2.5 Hz, and/or applying 1220 to the adjusted NMR spectrum 213*a* a convolution function with a Pseudo-Voigt kernel to obtain a random line shape, wherein the gaussian ratio of the Pseudo-Voigt kernel is in the range from 0 to 1. A person skilled in the art may also use other convolutions functions for line broadening.

Further, a scaling module 135 may scale the adjusted NMR spectrum 213*a* by applying 1230 to the adjusted NMR spectrum a random multiplication factor in the range from 0 to an amplitude threshold. The amplitude threshold corresponds to an expected maximum concentration of the target molecule in the NMR sample 201.

In optional embodiments, the background generator 132 also includes line broadening 132-4 and scaling 132-5 modules. They work in a similar way as the modules 133 and 135. Line broadening 132-4 can adjust the generated mathematical model of the multiplet by applying 1421 to the adjusted mathematical model of the multiplet a Gaussian convolution with a random width in the range from 0.5 to 2.5 Hz, and/or by applying 1422 to the adjusted mathematical model of the multiplet a convolution function with a Pseudo-Voigt kernel to obtain a random line shape, with the gaussian ratio of the Pseudo-Voigt kernel in the range from 0 to 1. Scaling 132-5 can adjust the adjusted mathematical model by applying 1230 to the adjusted mathematical model of the multiplet a random multiplication factor in the range from 0 to an amplitude threshold. The amplitude threshold corresponds to an expected maximum concentration of the target molecule in the NMR sample 201 and can be the same amplitude as used by the scaling module 135.

Figure 5:
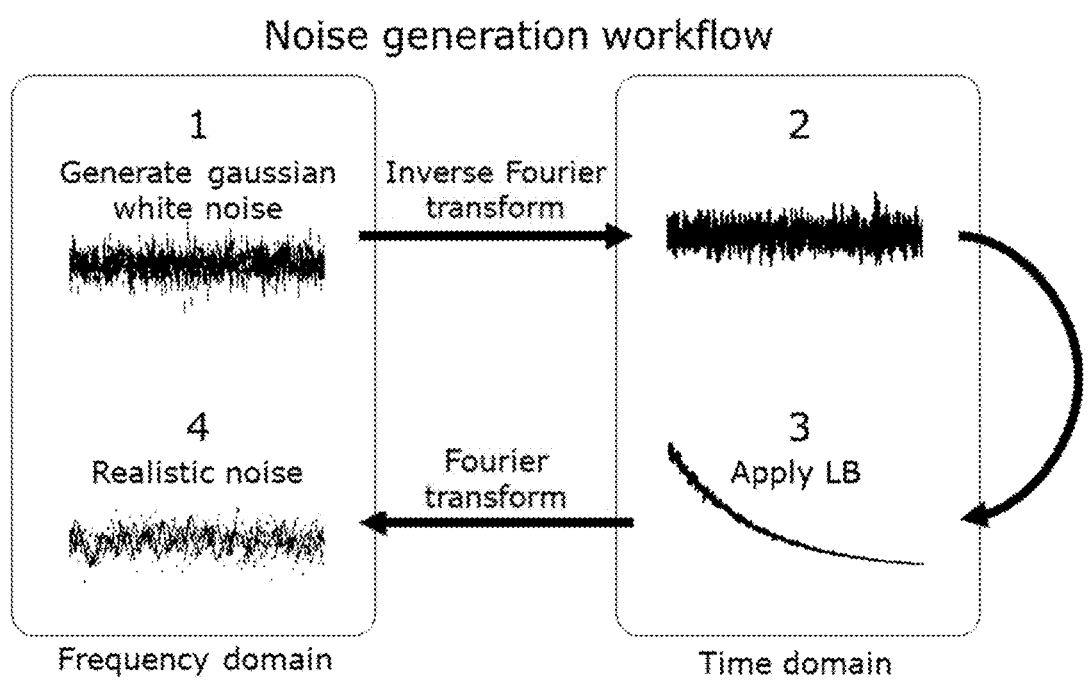
FIG. 5 illustrates an example workflow for realistic noise generation.

In an optional embodiment, the adjustment module 13 further includes a noise module 134 for adding 1240 noise to the adjusted spectrum 213*a*. Although noise (generated by the measuring equipment) can be also seen as part of the background spectrum, it shows an entirely different behavior than the background signals which are caused by impurities in the sample. For this reason, it is shown as an extra module in FIG. 1. The noise is added to the adjusted NMR spectrum before the resulting NMR spectrum 213*b* is stored in the training dataset. The noise can be added 1240 before or after the multiplet related background signals are added. As illustrated in FIG. 5, the noise is generated 1 using random gaussian noise centered at zero and with a standard deviation value of '1'. The generated Gaussian white noise is then transformed 2 into the time domain using an inverse Fourier transform. In real-world NMR spectra it is common to apply a line broadening (LB) filter to improve the signal-to-noise ratio. Therefore, it is advantageous to apply this LB filter also to the noise in step 3 of FIG. 5 by multiplying the noise by a decaying exponential with a time constant LB in the range of from −0.2 to 3 seconds. Finally, a Fourier transform is applied to the multiplied noise spectrum, and scaled 4 in order to have a standard deviation that is equal to the standard deviation of the noise measured in a real-world spectrum. For example, the standard deviation may be estimated by using a real-world measured NMR spectrum and computing the standard deviation in the noise region (typically 0 to 6 ppm).

Figure 6:
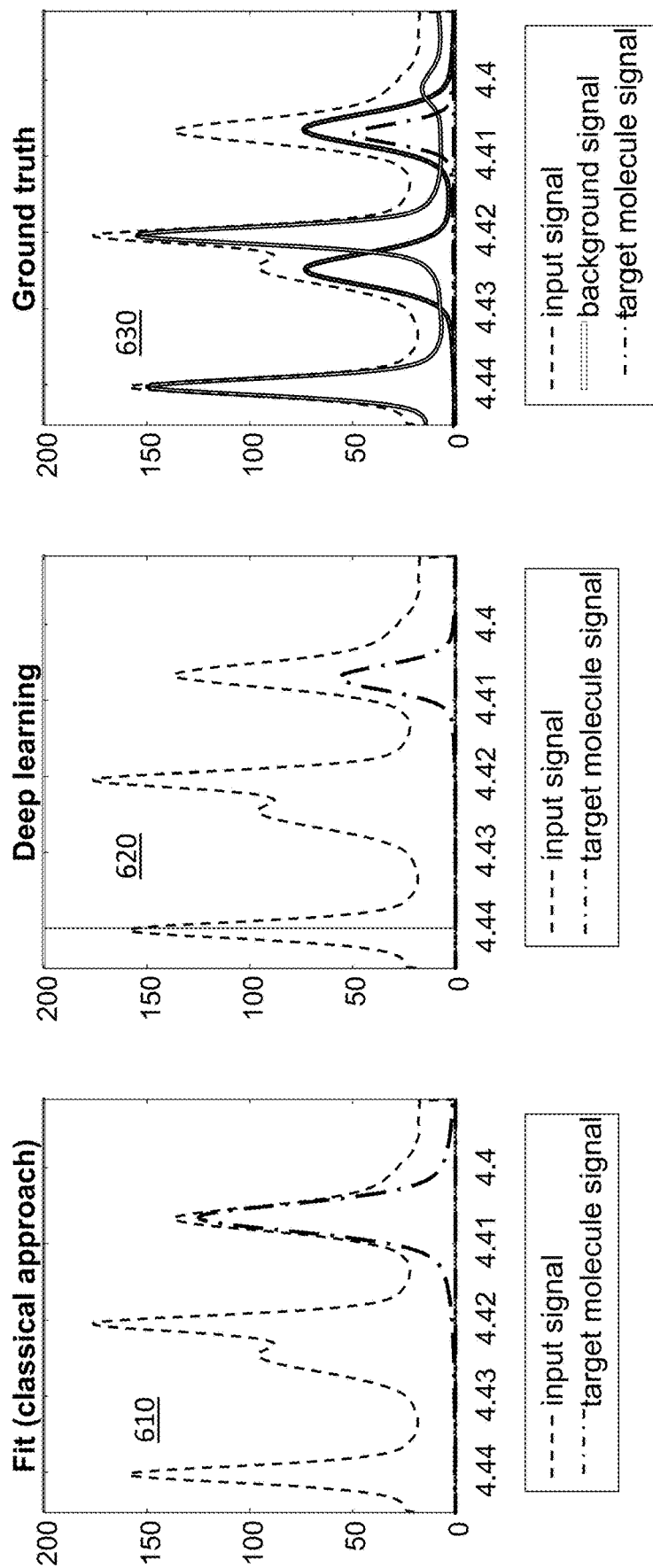
FIG. 6 shows a comparison of quantifying the concentration of a target molecule in an NMR sample by using a deep learning approach vs. by using a classic fitting approach.

FIG. 6 illustrates improvements in NMR signal detection for the purpose of quantifying the concentration of a target molecule in an NMR sample achieved by using the herein disclosed deep learning approach compared to using a classic fitting approach. When using the classic fitting approach 610, the target molecule signal in the example is fit with the input signal. This leads to a determination of the target molecule's concentration which is far too high, because the contribution of overlapping background signals cannot be taken into account with the classic fitting approach. In the ground truth box 630, the background signal (solid line) and the signal of the target molecule (dash-dotted line) were taken into account in a corresponding training data record where the actual concentration of the target molecule (being much smaller than the concentration estimated by the fitting approach) was part of the ground truth which is associated with the respective training input signal (dashed line). A deep learning neural network trained with such training data records shows the functional behavior as depicted in chart 620. The neural network has learned that in the measured input signal (dashed line) a significant contribution in the respective region of interest comes from the background spectrum and takes this into account when determining the concentration of the target molecule. The NN prediction of the target molecule concentration is by far more accurate than the concentration result obtained with the classic fitting approach 610.

Figure 7:
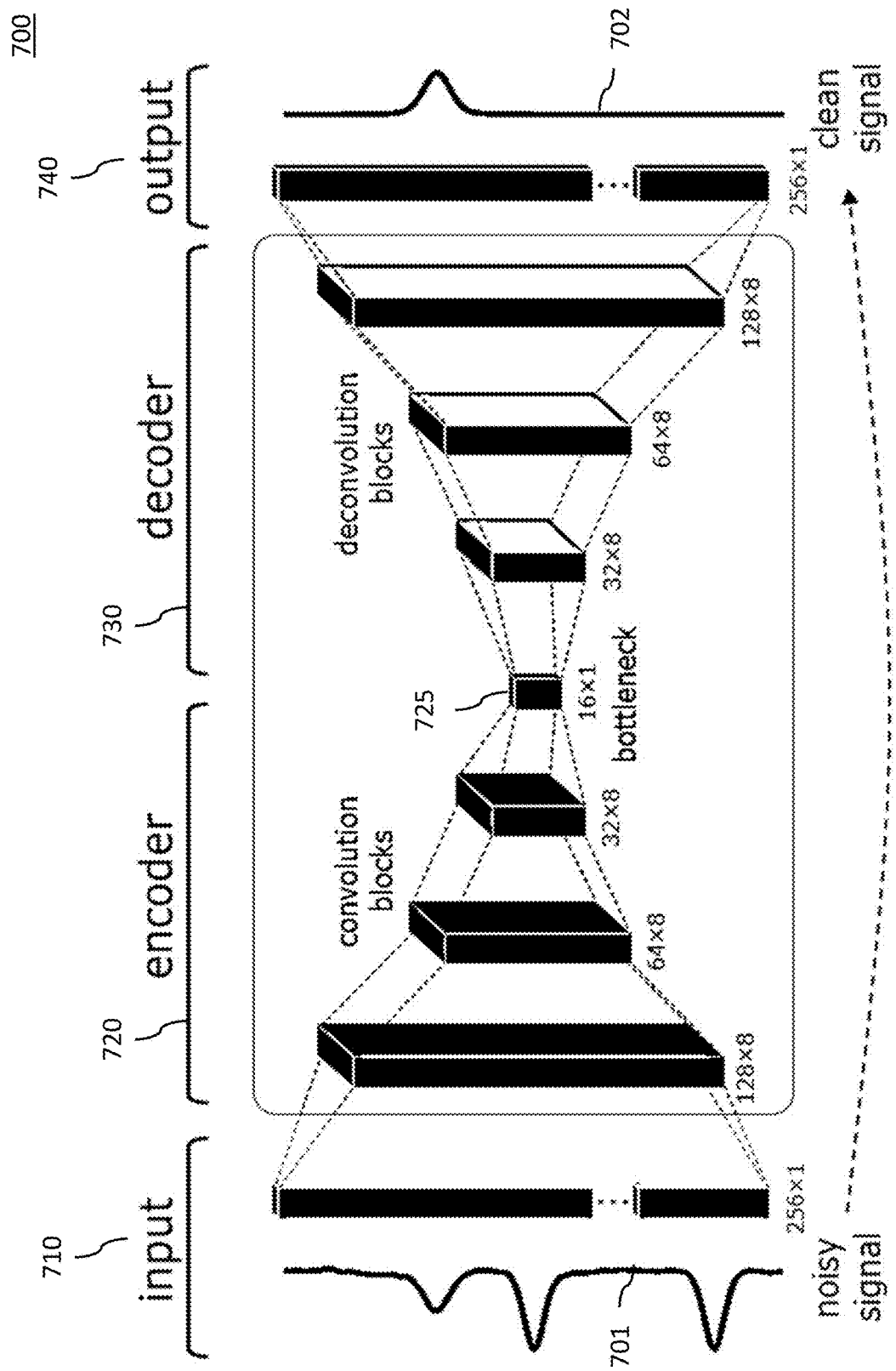
FIG. 7 illustrates an example topology of a neural network to be trained for determination of the concentration of a particular target molecule in an NMR sample.

FIG. 7 illustrates an example topology 700 of the to-be-trained neural network of the quantification embodiment. In the example, the topology implements a denoising autoencoder configured to remove noise and background signals from training input signals 701. The autoencoder has an encoder portion with convolution blocks (layers) 720, and a decoder portion with deconvolution blocks (layers) 730. The training input signal 701 (including noise and background signals) is received via the input layer 710 which has a size that matches the resolution of the input signal 701. The training input signal 701 is then encoded to a low number of components (at bottleneck 725) using the convolution blocks 720 of the encoder. The number of these components is advantageously in the range from 1 to 32 to force the neural network to learn only relevant features.

The example of FIG. 7 illustrates the implementation where the information about the concentration of the target molecule is implicitly included in the clean signal of the target molecule. The encoded training input signal is decoded again to obtain as output 740 the clean signal 702 for the NMR spectrum associated with the target molecule. The concentration of the target molecule which is represented by the clean signal 790 is then compared to the ground truth and the weights of the neural network are adjusted accordingly. Storing the clean signal of the target molecule as ground truth (with the subsequent computation of the concentration as the integral of the resulting clean signal) can be advantageous compared to storing the plain concentration value as ground truth. The clean signal approach provides a way to visualize the output of the NN (i.e., the clean signal) and allows a skilled person to interpret the consistency of the quantification result provided by the neural network. Presenting an overlay of the noisy input spectrum 701 and the "cleaned" spectrum 702 on the same plot results in a comparison chart similar to chart 620 of FIG. 6. Such a comparison chart can considerably support the interpretation of the result provided by the neural network. One of the biggest drawbacks of using a neural network—namely the black box behavior of a neural network—is therefore overcome by providing such comparison charts to a user. When only using the concentration value instead, only a single value is available (e.g., q=40.25) which it more difficult to interpret. With the topology described in FIG. 7, based on a training dataset built in accordance with the method depicted in FIG. 2, a Root Mean Squared Error (RMSE)=7.01 [mg/kg] was obtained, whereas for the classic fitting method the Root Mean Squared Error was RMSE=24.7 mg/kg.

When a test input signal is received from a real NMR measurement of an NMR sample (including the target molecule) by the input layer 710 of the neural network which has been trained using the generated training dataset with the synthetic resulting NMR spectra, the trained neural network predicts the concentration of the target module with high accuracy and reliability.

Figure 8:
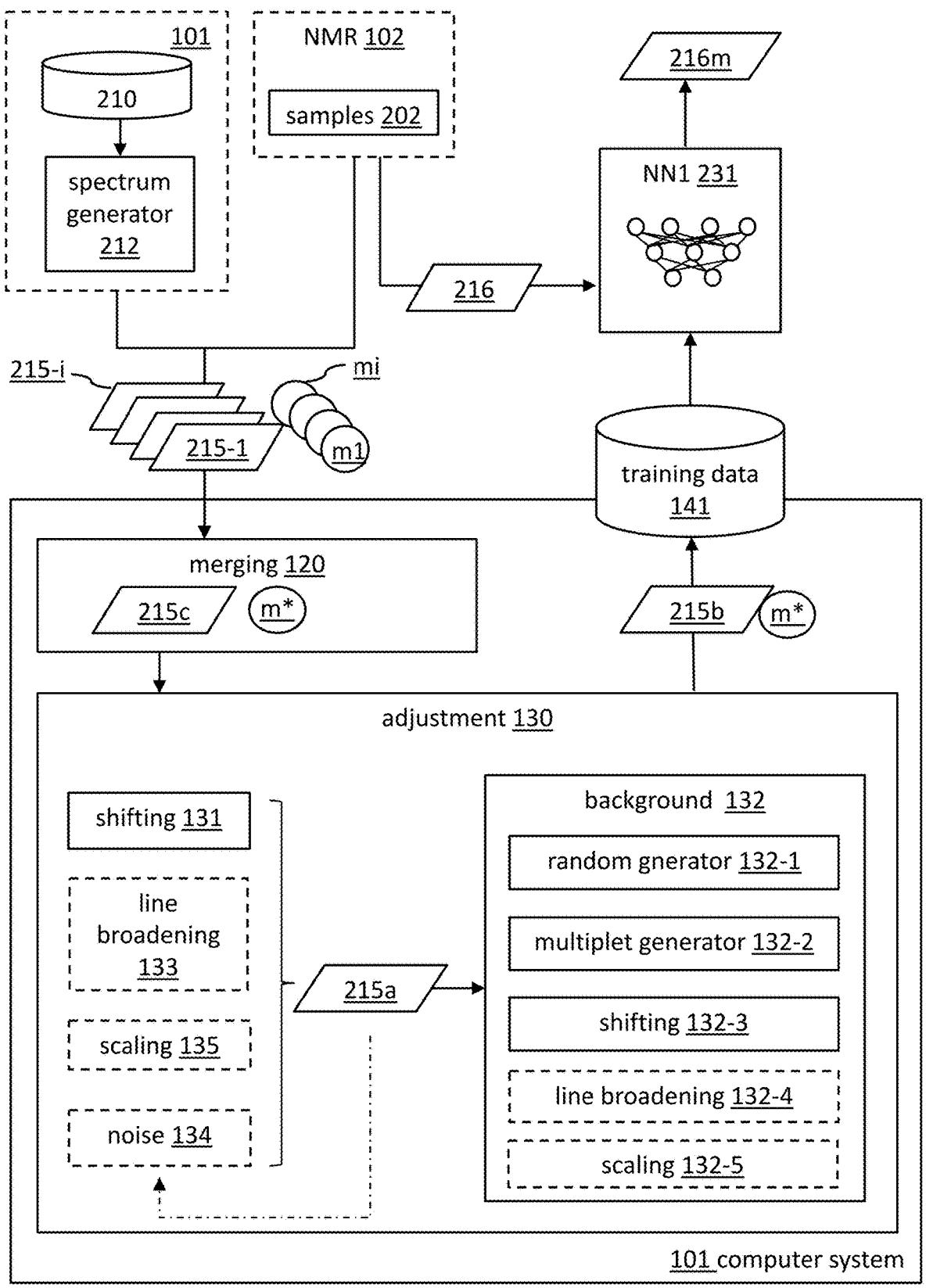
FIG. 8 includes a block diagram of a computer system for generating a training dataset configured to train a neural network for identification of different molecules of interest present in an NMR sample according to an identification embodiment.

FIG. 8 illustrates a computer system 101 for generating a data record of a training dataset 141 to train a neural network 231 for identification of different molecules m1 to mi present in an NMR sample 202 (the identification embodiment). Once NN1 has been trained with the training dataset 141 generated by the system 101, it can predict the mixture 216*m* of target molecules which are present an NMR sample 202 by simply receiving a measured NMR spectrum 216 obtained from said sample 202 as test input.

Figure 9:
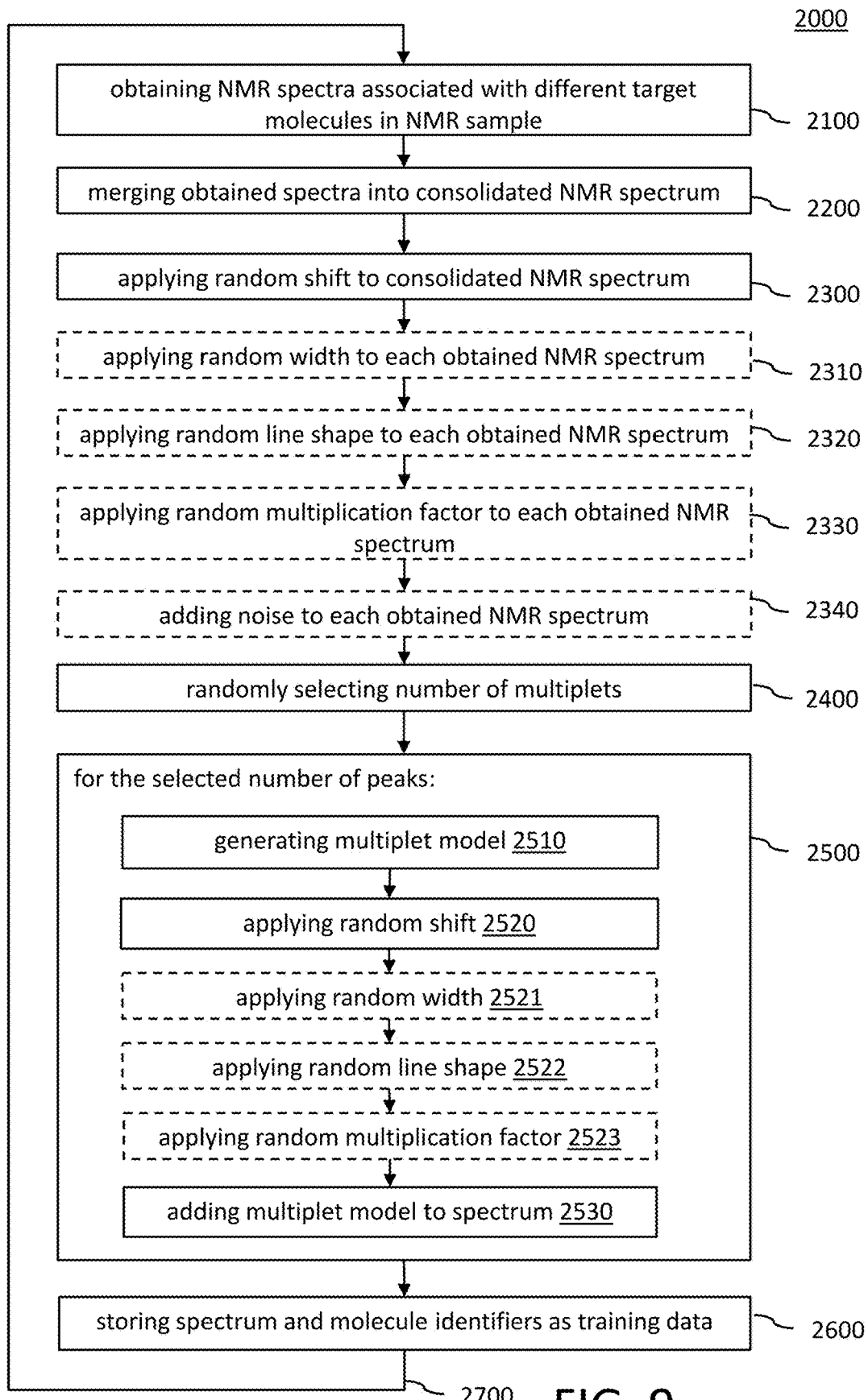
FIG. 9 is a simplified flow chart of a computer-implemented method for generating a training dataset configured to train a neural network for identification of different molecules of interest present in an NMR sample according to the identification embodiment.

The adjustment component 130 of system 101 corresponds to the adjustment component of system 100 of the quantification embodiment. Therefore, computer system 101 can apply the same adjustment operations to a spectrum as the ones disclosed in the context of the quantification embodiment. For the reason of conciseness, the description of these steps is not repeated in detail. The skilled reader can retrieve the respective information from the description of the quantification embodiment. The system 101 of FIG. 8 is described in the context of the simplified flow chart of a computer-implemented method 2000 for generating such a realistic training dataset 141 as illustrated in FIG. 9. Therefore, the following description of the identification embodiment refers to reference numbers used in FIG. 8 and FIG. 9. The system 101 is thereby configured to execute the method 2000 when loading a respective computer program into a memory of the system and executing said program with processing means of the system.

A difference of system 101 over system 100 of the quantification embodiment is that system 101 not only obtains a single NRM spectrum associated with one target molecule, but rather obtains 2100 an NMR spectrum 215-1 to 215-i for each molecule m1 to mi which is present in a respective NMR sample. Such molecules are randomly selected form a molecule database 210 which includes all molecules that can be substantial candidates to NMR analysis. This molecule database 210 can include data relating to several hundreds of molecules. Each obtained NMR spectrum has a region of interest, wherein the region of interest is again a region in the obtained NMR spectrum where the respective NMR spectrum exceeds a predefined noise threshold value. The to-be-generated data record of the training dataset 141 needs to be generated such that the neural network 231 (NN1) can learn to distinguish NMR spectra obtained from samples 202 including a mixture of a particular set of molecules m1 to mi (from said molecule database 210) from any other NMR spectrum.

As for the quantification embodiment, the NMR spectra for the identification embodiment can again be obtained from NMR spectrum providing entities, such as the spectrum generator 212 (as described in the context of the quantification embodiment) or a database NMR 102 providing measured NMR spectra obtained from NMR samples 202 including a mixture of the target molecules m1 to mi.

The system 101 receives the NMR spectra 215-1 to 215-i together with respective identifiers of the molecules m1 to mi present in a respective NMR sample. In addition to the modules of system 100 of the quantification embodiment, the identification system 101 has a merging module 120 which merges 2200 the obtained NMR spectra 215-1 to 215-i into a consolidated NMR spectrum 215c reflecting the mixture of the different molecules in the respective NMR sample. Together with the consolidated spectrum 215c, the merging module creates a list of all identifiers m* of the present molecules. Advantageously, the identifiers are organized in a molecule ID vector which has a vector element for each molecule of the molecule database where the vector elements representing the molecules present in said NMR sample are set to '1' and all other vector elements are set to '0'. That is, the list of identifiers m* may be stored in the vector elements m1 to mi of said molecule ID vector. An example of a molecule ID vector is the vector 13-1 illustrated in FIG. 10B.

In the following, the adjustment module of system 101 applies the same adjustments to the consolidated spectrum 215c as were applied by system 100 directly to the obtained spectrum 213 (cf. FIG. 1).

In a first step, the consolidated NMR spectrum 215c is adjusted by applying 2300 a random shift in the range from −0.2 ppm to +0.2 ppm to obtain an adjusted NMR spectrum 215a. Subsequently, the background generator 132 of the adjustment module 130 is adding impurity related background signals to the adjusted spectrum 215a. For this purpose, the random selector 132-1 randomly 2400 determines, in the range from 1 multiplet/ppm multiplied with the width of the region of interest to 100 multiplets/ppm multiplied with the width of the region of interest, a number of multiplets N reflecting the background of a resulting NMR spectrum.

Again, in a loop 2500 with N iterations, the background generator is adding a multiplet spectrum to the adjusted spectrum during each iteration. That is, in each iteration, the multiplet generator 132 generates 2510 a mathematical model of a multiplet, and the shifting module adjusts the generated mathematical model of the multiplet by applying 2520 a random shift in the range of the region of interest to obtain an adjusted mathematical model of the multiplet. The shifted mathematical model is then added 2530 to the region of interest of the adjusted NMR spectrum 215a. After the iteration of the loop the resulting NMR spectrum 215b includes all generated background signals associated with the generated multiplets. As for the quantification embodiment, the multiplets can be generated based on mathematical models using a random peak list, or the they can be generated based on peak lists extracted from real measured NMR spectra.

The resulting NMR spectrum is then stored 2600 together with the identifiers m* of the underlying molecules as a new data record of the training dataset 141. In the identification embodiment, molecule ID vector with the list m* of the molecule identifiers (of present molecules) represents the ground truth for NN1 during the training process when learning mixture identification on the basis of the generated training data record 215b. To generate the entire training dataset 141, system 101 repeats 270 the generation of new training data records until the training dataset has reached a size which is sufficient for training NN1 such that a sufficient prediction accuracy and reliability is reached when predicting a target molecule mixture 216m based on a real measured NMR spectrum 216 obtained from a respective NMR sample 216.

Besides the shifting and multiplet adjustments, the amended spectrum can be further adjusted by using the line broadening modules 133, 132-4, the scaling modules 135, 132-5, and the noise generation module 134 as described in the context of the quantification embodiment.

Figure 10A:
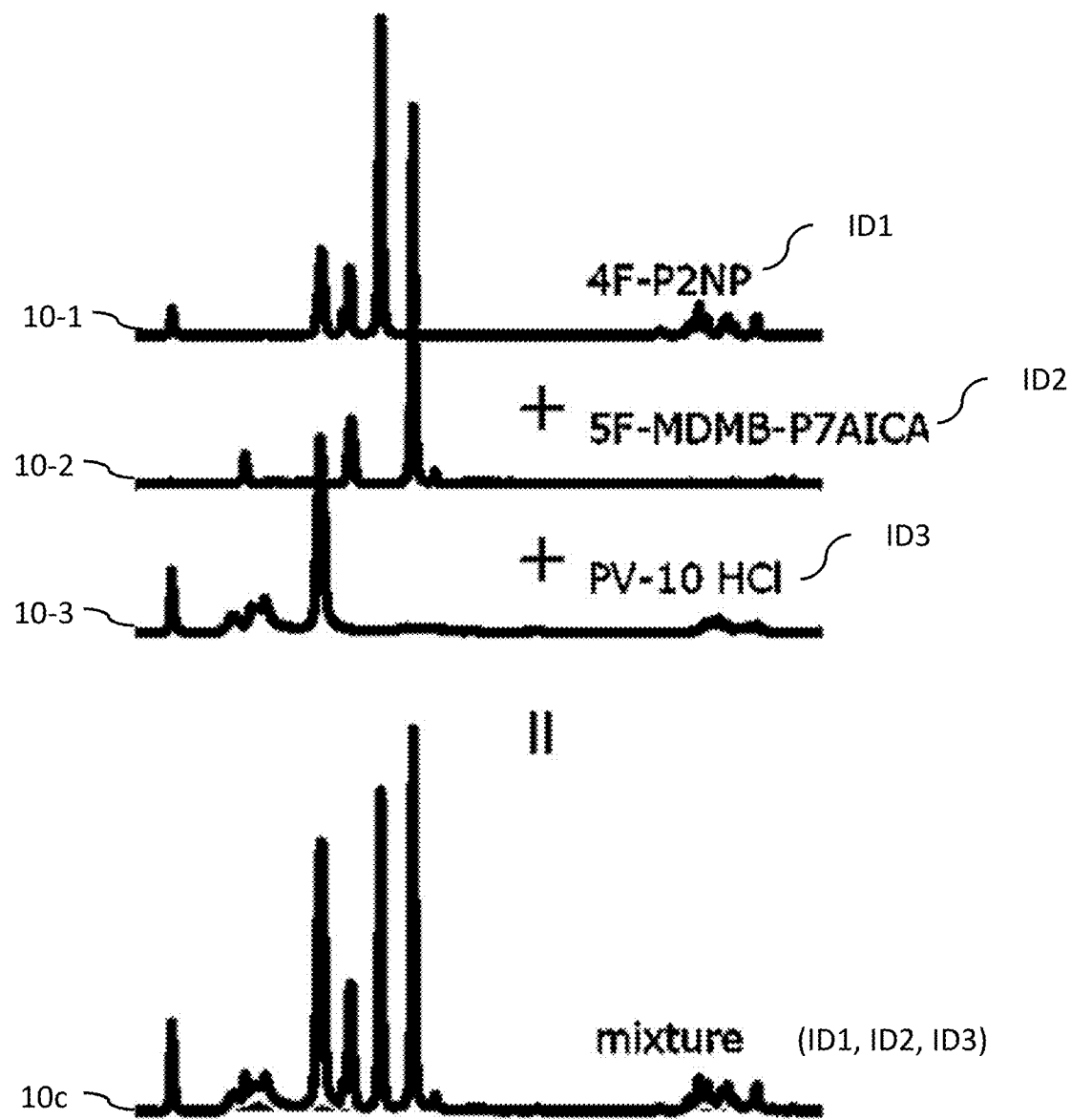
FIG. 10A illustrates merging of target molecule specific NMR spectra into a consolidated NMR spectrum.
Figure 10B:
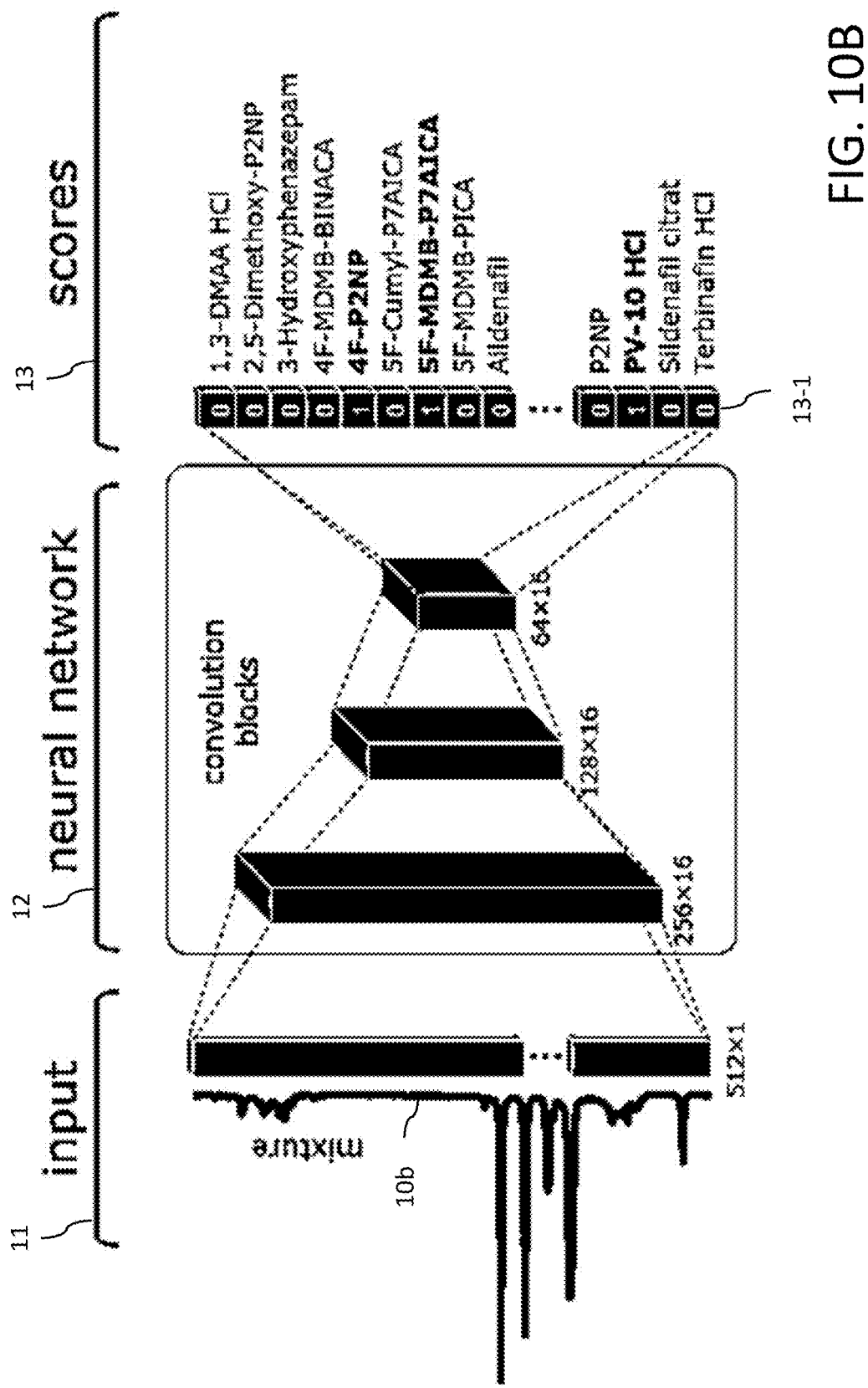
FIG. 10B illustrates an example topology of a neural network to be trained for identification of different molecules present in an NMR sample.

FIG. 10A illustrates a further example with three NMR spectra 10-1, 10-2, 10-2 associated with three different molecules (molecule identifiers ID1 to ID3), which are merged into the consolidated NMR spectrum 10c with the identifier list (ID1, ID2, ID3). In FIG. 10B, the resulting spectrum 10b (after having applied the above-described adjustment mechanisms with at least shift and background adjustments) is then loaded as training input into the input layer 11 of the to-be-trained neural network. In the identification embodiment, the neural network has a topology comprising a convolutional neural network with convolution blocks 12 implementing a convolution function, a pooling function and an activation function, followed by a fully connected layer 13 with a size equal to the number of molecules in the molecule database for which the neural network is trained. A person skilled in the art may use dimensions for the neural network layers which differ from the example values shown in FIG. 10B. The size of the molecule database advantageously corresponds to the number of molecules for which the spectrum generator can provide synthetic NMR spectra, or to the number of molecules for which real-world spectra are available in a corresponding database. The list with identifiers (ID1, ID2, ID3) of the three target molecules in FIG. 10A is part of the vector used as the ground truth for the neural network when processing the resulting NMR spectrum 10b. This is reflected by the scores of 1 for the molecule identifiers associated with the resulting spectrum 10b. In general, the output of the neural network is a score in the range of 0 to 1 for each molecule of the molecule database.

Figure 11A:
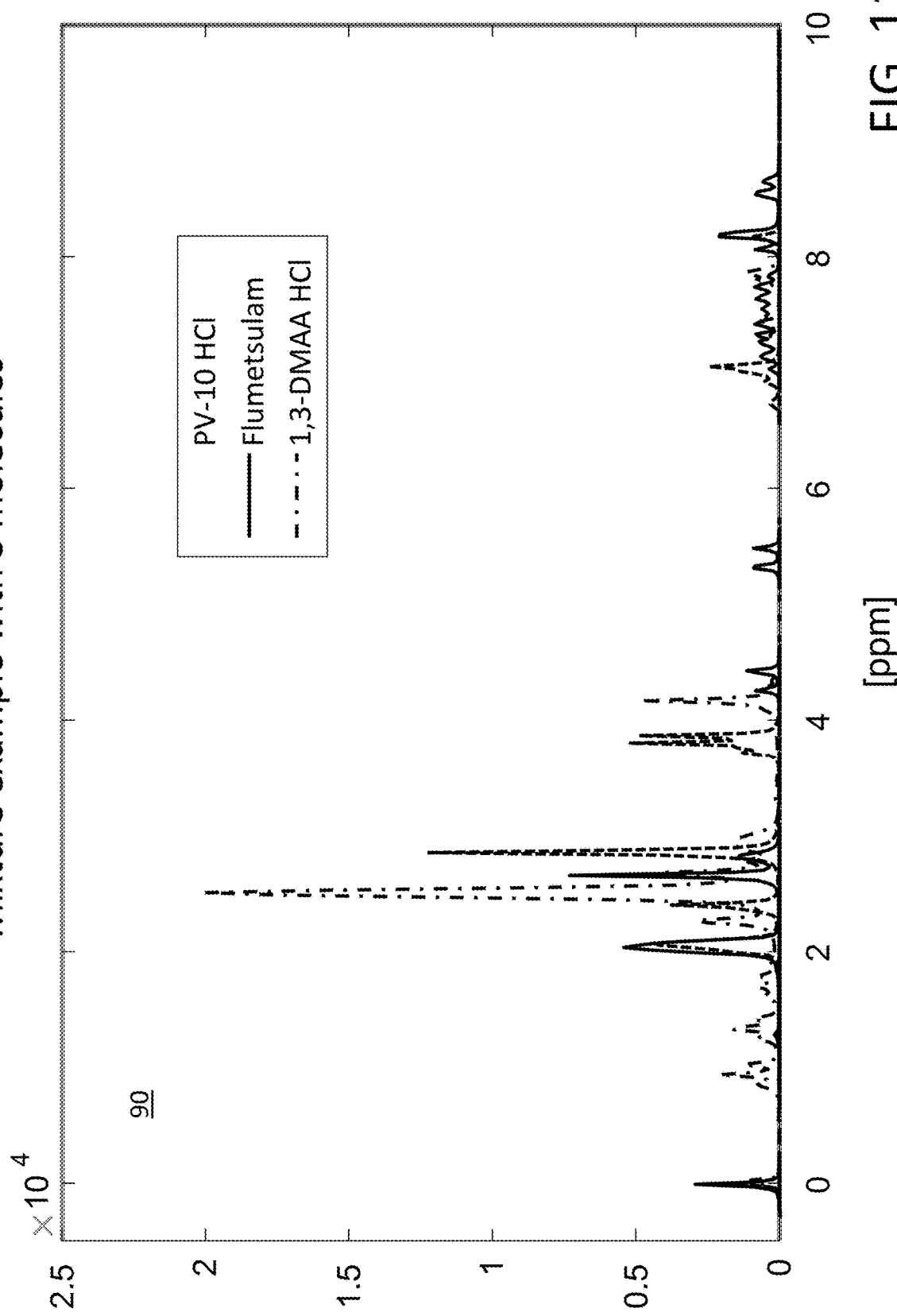
FIG. 11A shows a measured NMR spectrum highlighting the contributions of three molecules present in the respective NMR sample.

In the example test spectrum 90 of FIG. 11A, the NMR spectra of the three target molecules PV-10 HCl (dashed line), Flumetsulam (solid line) and 1,3-DMAA HCl (dash-dotted line) contribute to spectrum 90 which serves as a test input to the trained neural network in the identification embodiment. FIG. 11B shows the output scores for all target molecules for the identification of which the neural network has been trained. The score for the three molecules of interest underlying the test spectrum 90 is '1' (rows with score in bold italics). For most of the other target molecules which were not present in the respective NMR sample, the score is '0' or at least close to '0' (e.g., Bromantan '0.01', Flualprazolam '0.03', etc.). This example demonstrates that the identification embodiment can predict the underlying mixture of molecules in a respective NMR sample by simply receiving the associated measured NMR spectrum as test input with high accuracy and reliability. For the above example, the True Positive Rate (TPR) achieved by the trained NN1 was determined at 97.0%, whereas the False Positive Rate (FPR) was only at 0.1%.

Figure 12:
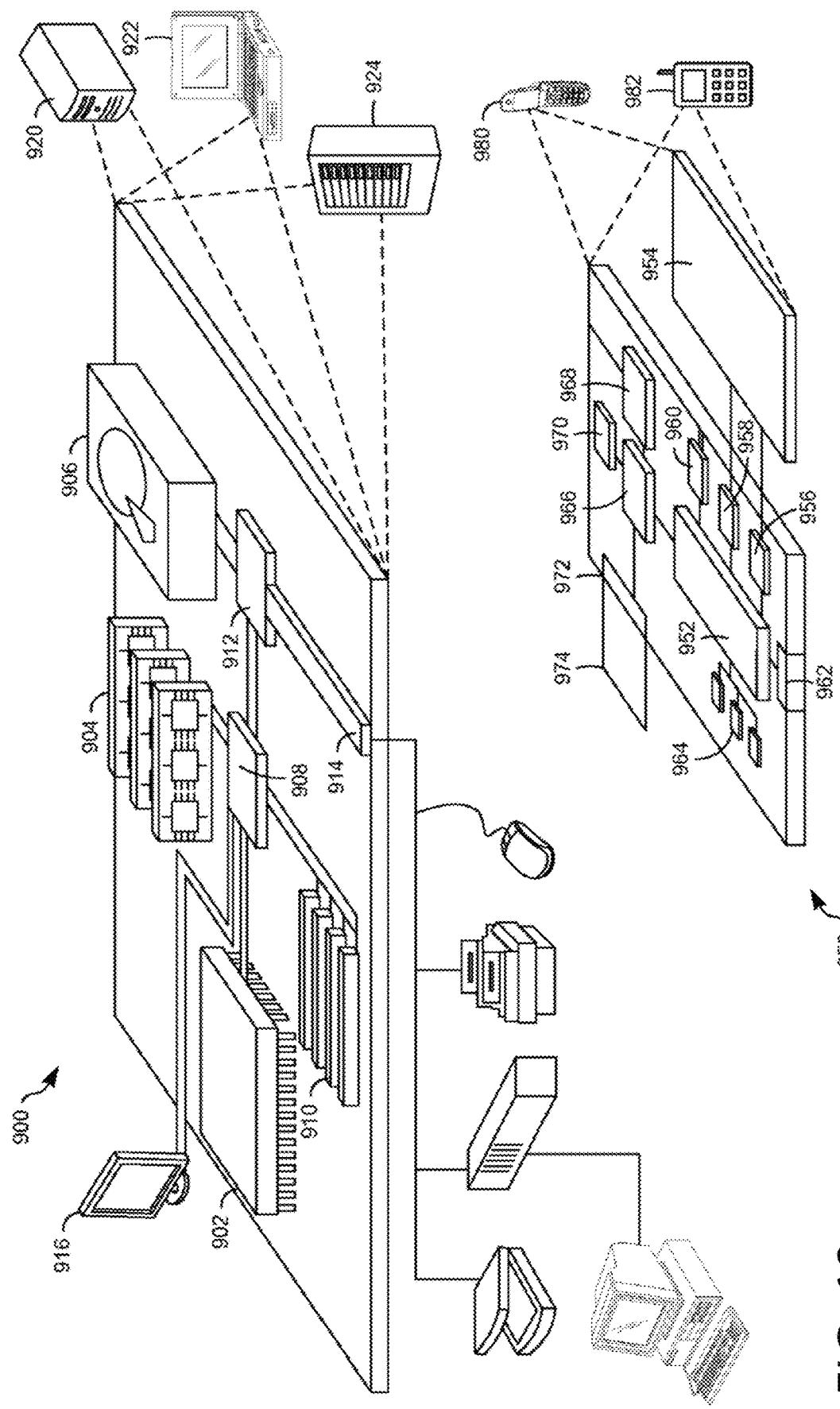
FIG. 12 is a diagram that shows an example of a generic computer device and a generic mobile computer device which may be used with the techniques described herein.

FIG. 12 is a diagram that shows an example of a generic computer device 900 and a generic mobile computer device 950, which may be used with the techniques described here. In some embodiments, computing device 900 may relate to system 100 (cf. FIG. 1) or 101 (cf. FIG. 8). Computing device 950 is intended to represent various forms of mobile devices, such as personal digital assistants, cellular telephones, smart phones, and other similar computing devices. In the context of this disclosure the computing device 950 may provide I/O means for a user to interact with the computing device 950. In other embodiments, the entire system 100 may be implemented on the mobile device 950. The components shown here, their connections and relationships, and their functions, are meant to be exemplary only, and are not meant to limit implementations described and/or claimed in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high speed controller 908 manages bandwidth-intensive operations for the computing device 900, while the low speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 984 may also be provided and connected to device 950 through expansion interface 982, which may include, for example, a SIMM (Single In Line Memory Module) card interface. Such expansion memory 984 may provide extra storage space for device 950, or may also store applications or other information for device 950. Specifically, expansion memory 984 may include instructions to carry out or supplement the processes described above, and may include secure information also. Thus, for example, expansion memory 984 may act as a security module for device 950, and may be programmed with instructions that permit secure use of device 950. In addition, secure applications may be provided via the SIMM cards, along with additional information, such as placing the identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 984, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 980 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing device that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing device can include clients and servers. A client and server are generally remote from each other and typically interact through a communication network. The relationship of client and server arises by virtue of computer programs running on the respective computers and having a client-server relationship to each other.

The invention claimed is:

1. A computer-implemented method for generating a data record of a training dataset set configured to train a neural network for determination of a concentration of a target molecule in an NMR sample, comprising:
obtaining an NMR spectrum associated with a known concentration of the target molecule, with the obtained NMR spectrum having a region of interest in which the NMR spectrum exceeds a predefined noise threshold value;
adjusting the obtained NMR spectrum by applying a random shift in a range from −0.2 ppm to +0.2 ppm of the region of interest to generate an adjusted NMR spectrum;
randomly determining a number N of multiplets representing a background of a resulting NMR spectrum wherein N is determined by multiplying a multiplet density with a width of the region of interest, with the multiplet density being randomly chosen from a predefined multiplet density range;
repeating, for N iterations:
generating a mathematical model of a multiplet of the number of multiplets;
adjusting the generated mathematical model of the multiplet by applying a random shift in the range of the region of interest to obtain an adjusted mathematical model of the multiplet;
adding the adjusted mathematical model to the region of interest of the adjusted NMR spectrum; and
storing, after iteration N of the N iterations, information about the concentration of the target molecule together with the adjusted NMR spectrum as the resulting NMR spectrum as the data record of the training dataset.

2. The method of claim 1, wherein adjusting the NMR spectrum further comprises at least one of the following steps:
applying to the adjusted NMR spectrum a Gaussian convolution with a random width in the range from 0.5 to 2.5 Hz;
applying to the adjusted NMR spectrum a convolution function with a Pseudo-Voigt kernel to obtain a random line shape, wherein a gaussian ratio of the Pseudo-Voigt kernel is in a range from 0 to 1;
applying to the adjusted NMR spectrum a random multiplication factor in a range from 0 to an amplitude threshold, wherein the amplitude threshold corresponds to an expected maximum concentration of the target molecule in the NMR sample.

3. The method of claim 1, wherein obtaining the NMR spectrum comprises generating, based on a peak list for the target molecule, a mathematical model of the target molecule using one of the following: a pseudo-Voigt function, a Gaussian function, a Lorentzian function, or a Voigt function.

4. The method of claim 1, wherein obtaining the NMR spectrum comprises selecting, from a plurality of measured NMR spectra obtained from NMR samples including the target molecule, a measured NMR spectrum with an amplitude at least an order of magnitude higher than any other signal or noise overlapping with a spectrum of the target molecule.

5. The method of claim 1, wherein adjusting the generated mathematical model of the multiplet further comprises at least one of the following steps:
applying to the adjusted mathematical model of the multiplet a Gaussian convolution with a random width in a range from 0.5 Hz to 2.5 Hz;
applying to the adjusted mathematical model of the multiplet a convolution function with a Pseudo-Voigt kernel to obtain a random line shape, with a gaussian ratio of the Pseudo-Voigt kernel in a range from 0 to 1;
applying to the adjusted mathematical model of the multiplet a random multiplication factor in the range from 0 to an amplitude threshold, wherein the amplitude threshold corresponds to an expected maximum concentration of the target molecule in the NMR sample.

6. The method of claim 1, wherein generating the mathematical model of the multiplet further comprises:
generating a mathematical model of a singlet or a doublet or a triplet based on a random peak list using one of the following: a pseudo-Voigt function, a Gaussian function, a Lorentzian function, or a Voigt function.

7. The method of claim 1, wherein generating the mathematical model of the multiplet further comprises:
extracting peak positions and intensities of multiplet-related peaks in the region of interest from a database of two-dimensional measured NMR spectra by using of a peak picking algorithm; and
using the extracted peak positions and intensities to generate the mathematical model of the multiplet using one of the following: a pseudo-Voigt function, a Gaussian function, a Lorentzian function, or a Voigt function.

8. The method of claim 1, further comprising:
prior to storing the resulting NMR spectrum to the training dataset, adding a white Gaussian noise to the adjusted NMR spectrum by:
multiplying transformed noise in a time domain by a decaying exponential with a time constant LB in a range of from −0.2 to 3 seconds;
applying an inverse Fourier transform; and
scaling in order to have a standard deviation that is equal to a standard deviation of the noise measured in a real-world spectrum.

9. A non-transitory computer program product for generating a data record of a training dataset configured to train a neural network for determination of the concentration of a particular target molecule in an NMR sample, comprising computer-readable instructions that, when loaded into a memory of a computing device and processed by one or more processors of the computing device, cause the computing device to execute the method steps according to claim 1.

10. A computer system with a non-transitory memory and one or more processors for generating a data record of a training dataset configured to train a neural network for determination of the concentration of a particular target molecule in an NMR sample, with functional modules implemented by software stored using the non-transitory memory and executed by the one or more processors, wherein the functional modules implement functions of the computer system to be executed at runtime by the computer system, with the implemented functions configured to execute the method steps of claim 1.

11. The computer system of claim 10, wherein the to-be-trained neural network has a topology comprising a denoising autoencoder configured to remove noise and background signals from training input signals, wherein a training input signal is encoded to a number of components, with the number of components in the range from 1 to 32, to force the neural network to learn only relevant features, with the encoded training input signal being decoded to obtain as output a clean signal for the NMR spectrum associated with the target molecule.

12. A computer-implemented method for generating a data record of a training dataset configured to train a neural network for identification of different molecules present in an NMR sample, comprising:
obtaining an NMR spectrum for each molecule present in a respective NMR sample, with each obtained NMR spectrum having a region of interest in which the respective NMR spectrum exceeds a predefined noise threshold value;
merging the obtained NMR spectra into a consolidated NMR spectrum reflecting a mixture of the different molecules present in the respective NMR sample, and keeping a list of identifiers indicating the molecules present in the NMR sample;
adjusting the consolidated NMR spectrum by applying a random shift in a range from −0.2 ppm to +0.2 ppm of the region of interest to obtain an adjusted NMR spectrum;
randomly determining a number N of multiplets representing a background of a resulting NMR spectrum, wherein N is determined by multiplying a multiplet density with a width of the region of interest, with the multiplet density being randomly chosen from a predefined multiplet density range;
repeating, for N iterations:
generating a mathematical model of a multiplet of the number of multiplets;
adjusting the generated mathematical model of the multiplet by applying a random shift in the range of the region of interest to obtain an adjusted mathematical model of the multiplet;
adding the adjusted mathematical model to the region of interest of the adjusted NMR spectrum; and
storing, after iteration N of the N iterations, the identifiers indicating the molecules present in the NMR sample together with the adjusted NMR spectrum as the resulting NMR spectrum as the data record of the training dataset.

13. A non-transitory computer program product for generating a training dataset configured to train a neural network for identification of different molecules (m1 to mi) present in an NMR sample, the computer program comprising computer-readable instructions that, when loaded into a memory of a computing device and processed by one or more processors of the computing device, cause the computing device to execute the method steps according to claim 12.

14. A computer system with a non-transitory memory and one or more processors for generating a training data set configured to train a neural network for identification of different molecules (m1 to mi) present in an NMR sample, with functional modules implemented by software stored using the non-transitory memory and executed by the one or more processors, wherein the functional modules implement functions of the computer system to be executed at runtime by the computer system, with the implemented functions configured to execute the method steps of claim 12 at runtime.

15. The computer system of claim 14, wherein the to-be-trained neural network has a topology comprising a convolutional neural network with functional blocks implementing a convolution function, a pooling function and an activation function, followed by a fully connected layer with a size equal to the number of molecules included in a molecule database for which the neural network has been trained, with an output of the neural network being a score in the range of 0 to 1 for each molecule of the molecule database.

16. A computer-implemented method for determining the concentration of a target molecule in an NMR sample, comprising:
receiving a measured NMR spectrum of the NMR sample;
providing the measured NMR spectrum as test input to a trained neural network; and
the trained neural network predicting the concentration of the target molecule in response to the test input;
wherein said neural network has been trained using a generated training dataset with synthetic NMR spectra by:
obtaining an NMR spectrum associated with a known concentration of the target molecule, with the obtained NMR spectrum having a region of interest in which the NMR spectrum exceeds a predefined noise threshold value;
adjusting the obtained NMR spectrum by applying a random shift in a range from −0.2 ppm to +0.2 ppm of the region of interest to generate an adjusted NMR spectrum;
randomly determining a number N of multiplets representing a background of a resulting NMR spectrum wherein N is determined by multiplying a multiplet density with a width of the region of interest, with the multiplet density being randomly chosen from a predefined multiplet density range;
repeating, for N iterations:
generating a mathematical model of a multiplet of the number of multiplets;
adjusting the generated mathematical model of the multiplet by applying a random shift in the range of the region of interest to obtain an adjusted mathematical model of the multiplet;
adding the adjusted mathematical model to the region of interest of the adjusted NMR spectrum; and
storing, after iteration N of the N iterations, information about the concentration of the target molecule together with the adjusted NMR spectrum as the resulting NMR spectrum as a new data record of the training dataset.

* * * * *